US009330763B1

(12) United States Patent
Zhang et al.

(10) Patent No.: US 9,330,763 B1
(45) Date of Patent: May 3, 2016

(54) OPERATION MODES FOR AN INVERTED NAND ARCHITECTURE

(71) Applicant: SANDISK TECHNOLOGIES INC., Plano, TX (US)

(72) Inventors: Yanli Zhang, San Jose, CA (US); George Samachisa, San Jose, CA (US); Johann Alsmeier, San Jose, CA (US); Jian Chen, San Jose, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 0 days.

(21) Appl. No.: 14/557,004

(22) Filed: Dec. 1, 2014

(51) Int. Cl.
*G11C 16/04* (2006.01)
*G11C 16/26* (2006.01)
*G11C 16/10* (2006.01)

(52) U.S. Cl.
CPC ............ *G11C 16/0483* (2013.01); *G11C 16/10* (2013.01); *G11C 16/26* (2013.01)

(58) Field of Classification Search
CPC ........................... G11C 16/0483; H01L 27/15
USPC ........................................ 365/185.17, 185.18
See application file for complete search history.

(56) References Cited

U.S. PATENT DOCUMENTS

| 2010/0024732 | A1 | 2/2010 | Mokhlesi | |
|---|---|---|---|---|
| 2010/0072537 | A1 | 3/2010 | Bhattacharyya | |
| 2012/0164804 | A1* | 6/2012 | Bhattacharyya | B82Y 10/00 438/263 |
| 2012/0213009 | A1 | 8/2012 | Aritome | |

OTHER PUBLICATIONS

U.S. Appl. No. 14/317,274, entitled "Three Dimensional NAND Device with Channel Contacting Conductive Source Line and Method of Making Thereof," filed Jun. 27, 2014.
U.S. Appl. No. 10/762,181, "Non-Volatile Memory Cell Using High-K Material and Inter-Gate Programming," Mokhiesi, et al., filed Jan. 21, 2004.
PCT International Search Report and Written Opinion of the International Searching Authority, dated Nov. 23, 2015, PCT Application PCT/US2015/052071.

* cited by examiner

*Primary Examiner* — Huan Hoang
(74) *Attorney, Agent, or Firm* — Vierra Magen Marcus LLP

(57) ABSTRACT

Methods for performing memory operations on a memory array that includes inverted NAND strings are described. The memory operations may include erase operations, read operations, programming operations, program verify operations, and erase verify operations. An inverted NAND string may include a string of inverted floating gate transistors or a string of inverted charge trap transistors. In one embodiment, an inverted floating gate transistor may include a tunneling layer between a floating gate of the inverted floating gate transistor and a control gate of the inverted floating gate transistor. The arrangement of the tunneling layer between the floating gate and the control gate allows electrons to be added to or removed from the floating gate via F-N tunneling between the floating gate and the control gate. The inverted NAND string may be formed above a substrate and oriented such that the inverted NAND string is orthogonal to the substrate.

20 Claims, 14 Drawing Sheets

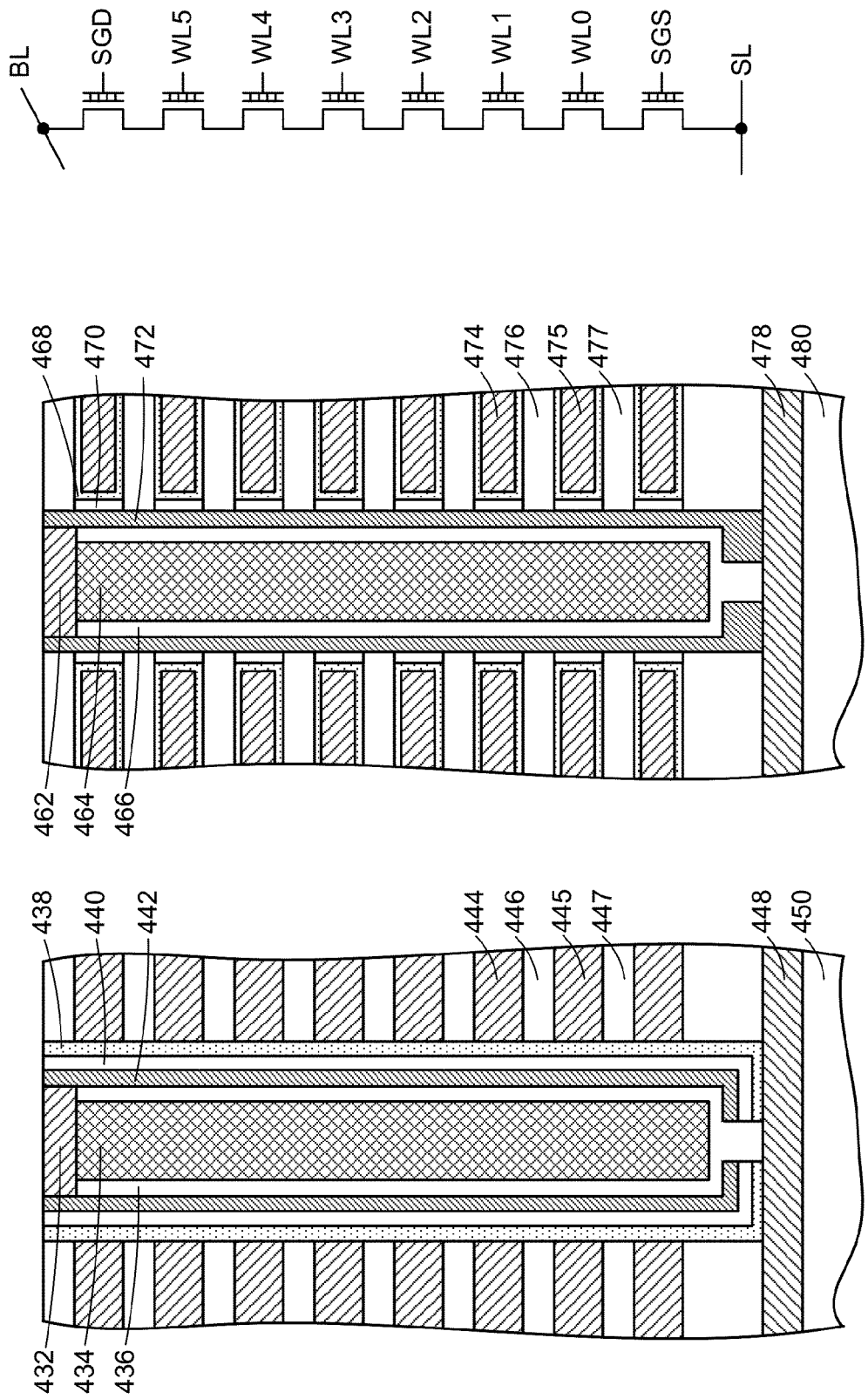

| | Operation Mode I | Operation Mode II |
|---|---|---|
| MLC Levels | Erase-state = highest programming state | Erase-state = highest programming state |
| Program verify | P-channel read | N-channel read |
| Erase verify | P-channel read | P-channel read |
| Soft-programming | May be omitted | May tighten Erase-state to reduce Vread |

OPERATION MODES FOR AN INVERTED NAND ARCHITECTURE

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim (F-N) tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates may be referred to as a NAND string. In recent years, NAND flash memory has been scaled in order to reduce cost per bit. However, as process geometries shrink, many design and process challenges are presented. These challenges include increased variability in memory cell characteristics and reduced data retention and cycling endurance.

BRIEF DESCRIPTION OF THE DRAWINGS

FIGS. 4C-4D depict various embodiment of vertical NAND structures.

FIG. 4E depicts one embodiment of a schematic representation of an inverted NAND string.

DETAILED DESCRIPTION

Figure 1:
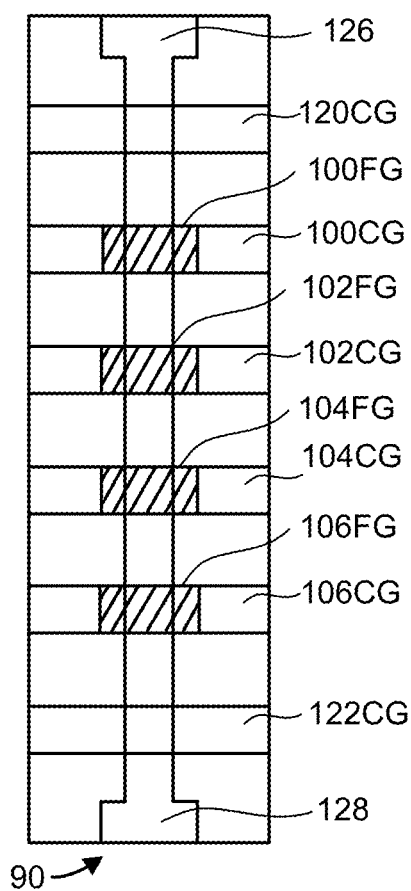
FIG. 1 depicts one embodiment of a NAND string.

Technology is described for performing memory operations on a memory array that includes inverted NAND strings. The memory operations may include erase operations, read operations, programming operations, program verify operations, and erase verify operations. An inverted NAND string may include a string of inverted floating gate transistors or a string of inverted charge trap transistors. In one embodiment, an inverted floating gate transistor may include a tunneling layer (e.g., a tunneling oxide) between a floating gate of the inverted floating gate transistor and a control gate of the inverted floating gate transistor. The arrangement of the tunneling layer between the floating gate and the control gate allows electrons to be added to or removed from the floating gate via F-N tunneling (or other tunneling mechanism) between the floating gate and the control gate. In another embodiment, an inverted charge trap transistor may include a tunneling layer (e.g., a tunneling oxide) between a charge trap layer of the inverted charge trap transistor and a control gate of the inverted charge trap transistor. In one embodiment, the inverted NAND string may be formed above a substrate and oriented such that the inverted NAND string is orthogonal to the substrate.

In some embodiments, an inverted NAND string may include asymmetric source and drain diffusions (or diffusion contacts) in which source and drain diffusions of different conductivity types are used to provide both an electron supply (e.g., via an n-type drain diffusion) and a hole supply (e.g., via a p-type source diffusion) for memory operations performed using the inverted NAND string. The memory operations may comprise n-channel read operations and/or p-channel read operations depending on the bias conditions applied to the inverted NAND string. The source-side of the inverted NAND string may be connected to a source line that is biased to a source line voltage and the drain-side of the inverted NAND string may be connected to a bit line that is biased to a bit line voltage. In one embodiment, if an n-channel read operation or an n-channel program verify operation is performed, then the bit line voltage may be greater than the source line voltage. In one example, the source line voltage may be set to 0V and the bit line voltage may be set to 2V. In another embodiment, if a p-channel read operation or a p-channel program verify operation is performed, then the bit line voltage may be less than the source line voltage. In one example, the source line voltage may be set to 2V and the bit line voltage may be set to 0V.

Benefits of using an inverted NAND string include improved data retention and cycling endurance. In one example, for inverted floating gate transistors, data retention times may be increased as the tunneling layer interface traps are farther away from the channel of the floating gate transistor. Furthermore, the use of inverted NAND structures may provide improved programming and erase speeds over a conventional 2D NAND structures.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate. In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

Figure 2:
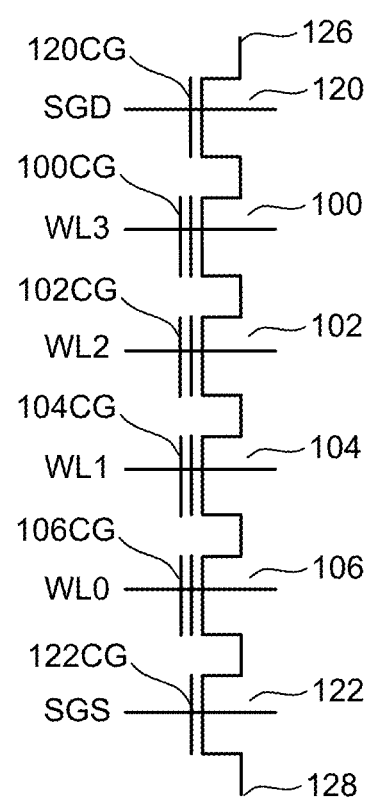
FIG. 2 depicts one embodiment of the NAND string of FIG. 1 using a corresponding circuit diagram.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Although technology using NAND-type flash memory is described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

Figure 3A:
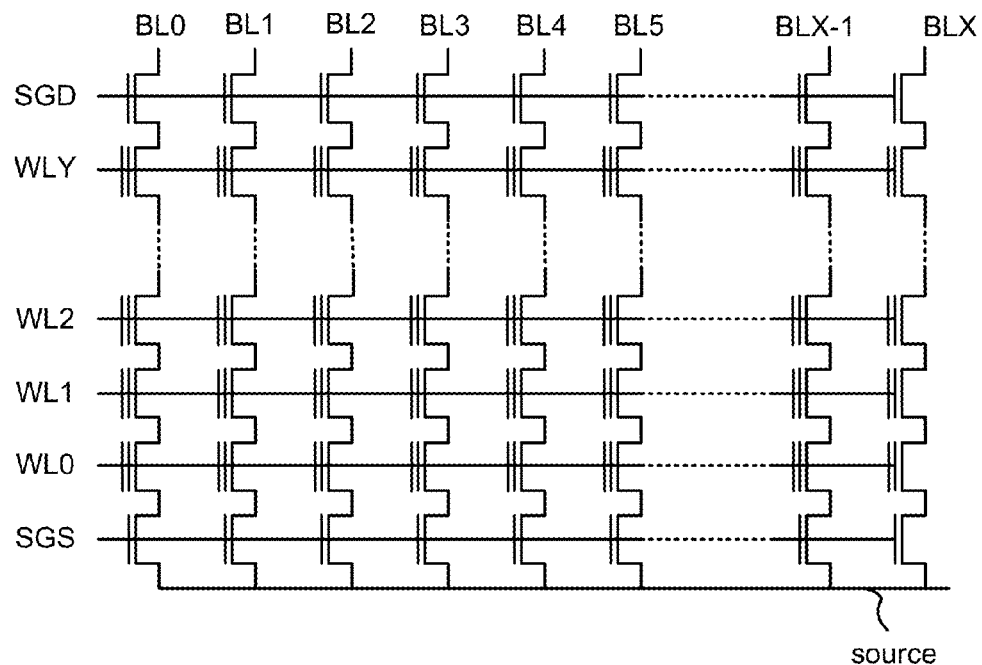
FIG. 3A depicts one embodiment of a memory block including a plurality of NAND strings.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure.

In some embodiments, in order to save space on a semiconductor die, two adjacent NAND strings (or other grouping in memory cells) may share a common bit line (i.e., a shared-bit-line memory architecture). In some cases, more than two NAND strings may share a common bit line. In one example, the signal SGD may be replaced by two drain-side selection signals SGD1 and SGD2. Each NAND string of the pair would then have two drain-side select gates, each connected to a different drain-side selection signal of the two drain side selection signals SGD1 and SGD2. One of the two drain-side select gates for each NAND string may be a depletion mode transistor with its threshold voltage lower than 0 volts. One potential problem with using two select gates on the drain side of each NAND string is that two drain-side select gates (as compared to one drain-side select transistor) requires more area on the die. Therefore, from an integrated circuit area standpoint, it may be beneficial to only use one drain-side selection gate for each NAND string and then connect each NAND string of the pair with only one of the two drain-side selection signals.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In one embodiment, memory cells may be erased by raising the p-well to an erase voltage (e.g., 20 volts) for a sufficient period of time and grounding the word lines of a selected block of memory cells while the source and bit lines are floating. These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

Figure 3B:
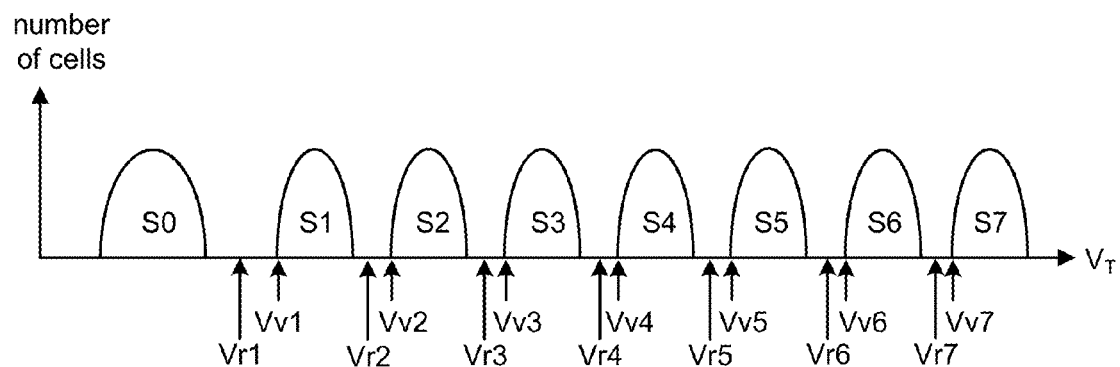
FIG. 3B depicts one embodiment of possible threshold voltage distributions for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 3C:
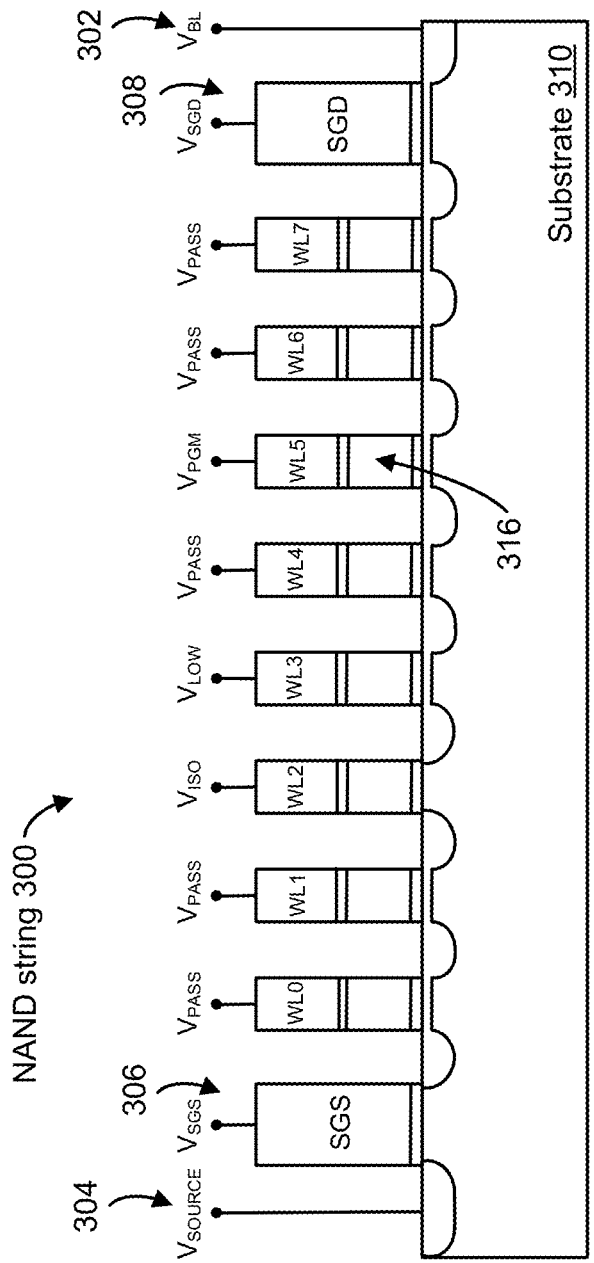
FIG. 3C depicts one embodiment of a NAND string during a programming operation.

FIG. 3C depicts one embodiment of a NAND string 300 during a programming operation. When programming a storage element (e.g., the storage element 316 associated with WL5) of the NAND string 300, a programming voltage may be applied to the selected word line associated with the storage element and a low voltage (e.g., ground) may be applied to the bit line associated with the storage element. As depicted, the NAND string 300 includes a source-side select gate 306, a drain-side select gate 308, and eight word lines WL0-WL7 formed above a substrate 310. $V_{SGS}$ may be applied to the source-side select gate 306 and $V_{SGD}$ may be applied to the drain-side select gate 308. The bit line 302 may be biased to $V_{BL}$ and the source line 304 may be biased to $V_{SOURCE}$. During a programming operation, a programming voltage, $V_{PGM}$, may be applied to selected word line WL5, which is associated with a selected storage element 316.

In one example of a boosting mode, when storage element 316 is the selected storage element, a relatively low voltage, $V_{LOW}$ (e.g., 2-6V) may be applied to a source-side word line (WL3), while an isolation voltage, $V_{ISO}$ (e.g., 0-4V) may be applied to another source-side word line (WL2), referred to as an isolation word line and a pass voltage, $V_{PASS}$, may be applied to the remaining word lines associated with NAND string 300 (in this case word lines WL0, WL1, WL4, WL6, and WL7). While the absolute values of $V_{ISO}$ and $V_{LOW}$ may vary over a relatively large and partly overlapping range, $V_{ISO}$ may be less than $V_{LOW}$. In some cases, $V_{ISO}$ may be less than $V_{LOW}$ which is less than $V_{PASS}$ which is less than $V_{PGM}$.

Figure 4A:
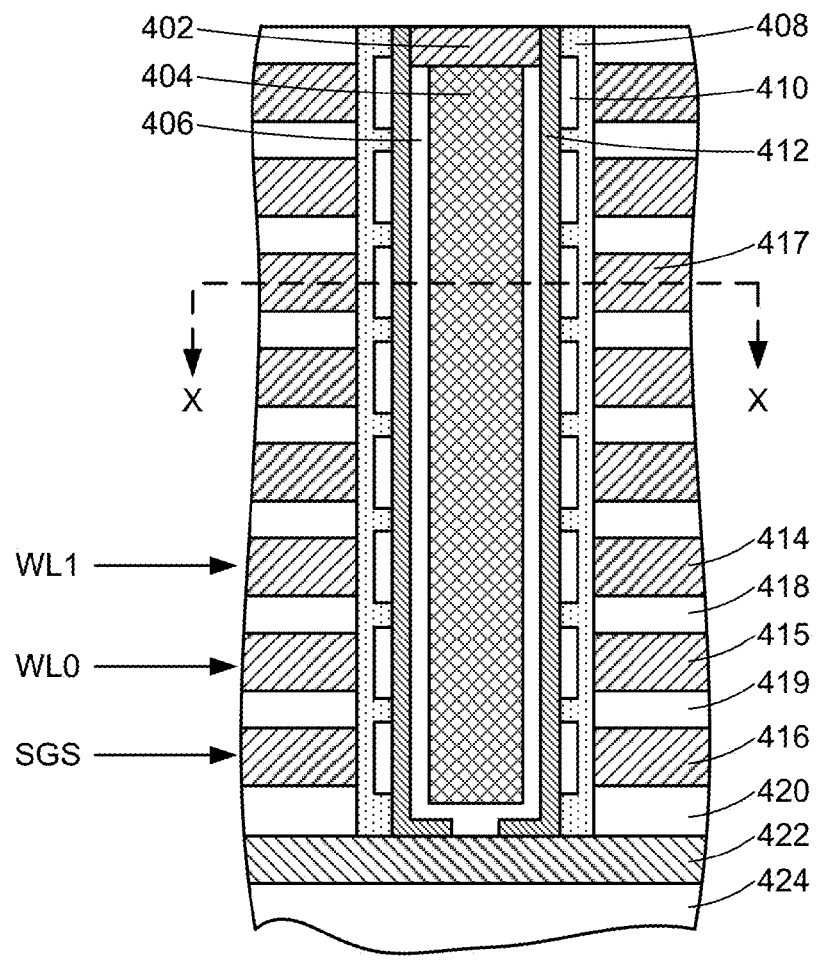
FIG. 4A depicts one embodiment of a vertical NAND structure.

FIG. 4A depicts one embodiment of a vertical NAND structure. The vertical NAND structure includes an inverted NAND string formed above the substrate 424 and oriented such that the inverted NAND string is orthogonal to the substrate 424. An inverted NAND string may comprise a NAND string that includes an inverted floating gate transistor with a tunneling oxide between a floating gate of the inverted floating gate transistor and a control gate of the inverted floating gate transistor. The arrangement of the tunneling oxide between the floating gate and the control gate allows the mechanism (e.g., F-N tunneling as the transport mechanism) for programming and/or erase of the inverted floating gate transistor to occur between the floating gate and the control gate rather than between the floating gate and the channel of the inverted floating gate transistor. The inverted NAND string may be arranged within a vertical memory hole that is etched through alternating layers of control gate material (e.g., tungsten, nitride, or polysilicon) and inter-gate insulator material (e.g., oxide or silicon dioxide). As depicted, the layers of control gate material include layer 417 and layers 414-416 and the layers of inter-gate insulator material include layers 418-420. The inter-gate insulator material layer 420 may be arranged above a source line layer 422 (e.g., doped polysilicon) that may be arranged above a substrate 424 (e.g., a silicon substrate). In some cases, a first word line (WL1) may correspond with control gate layer 414, a second word line (WL0) may correspond with control gate layer 415, and a source-side select gate line (SGS) may correspond with control gate layer 416.

In one embodiment, within the memory hole a tunneling layer material 408 (e.g., including a thin oxide), a floating gate material 410 (e.g., polysilicon), a dielectric layer 412 (e.g., oxide), and a channel layer material 406 (e.g., undoped polysilicon) may be deposited within the memory hole and arranged in order to form the inverted NAND string. As depicted in FIG. 4A, the tunneling layer material 408 is arranged within or inside of the memory hole. The tunneling layer material 408 may comprise a portion of a multi-layer dielectric stack such as an ONO dielectric stack, which includes alternating layers of silicon dioxide ("O") and silicon nitride ("N"). In some cases, the tunneling layer material 408 may comprise a high-K dielectric material (e.g., hafnium-based high-K dielectrics or hafnium oxide) that has a dielectric constant that is greater than that of silicon dioxide. In some cases, a core material layer 404 (e.g., oxide) may be formed within the memory hole. In other cases, the core material layer 404 may be omitted. A bit line contact layer 402 may be formed at the top of the memory hole and connect to or directly abut the channel layer material 406. The channel layer material 406 may connect to the source line layer 422 at the bottom of the memory hole. Thus, in this case, the bit line contact layer 402 connects to the inverted NAND string at the top of the memory hole and the source line contact layer 422 connects to the inverted NAND string at the bottom of the memory hole.

In one embodiment, the bit line contact layer 402 may comprise a material of a first conductivity type (e.g., n-type) and the source line contact layer 422 may comprise a material of a second conductivity type different from the first conductivity type (e.g., p-type). In one example, the bit line contact layer 402 may comprise an n-type material (e.g., n-type polysilicon) and the source line contact layer 422 may comprise a p-type material (e.g., p-type polysilicon). In another example, the bit line contact layer 402 may comprise a p-type material and the source line contact layer 422 may comprise an n-type material (e.g., n-type polysilicon). Thus, in some cases, the inverted NAND string may include an asymmetric source and drain that may be used to provide both an electron supply (via the n-type material) and a hole supply (via the p-type material) for memory operations (e.g., program, erase, and read operations) performed using the inverted NAND string. The memory operations may comprise n-channel operations and/or p-channel operations depending on the bias conditions applied to the inverted NAND string.

In one embodiment, an inverted NAND string may be formed using a core material layer (e.g., an oxide layer or other dielectric layer) that is arranged adjacent to a channel layer (e.g., an undoped polysilicon channel layer) that is arranged adjacent to a blocking layer (e.g., an oxide layer or other dielectric layer) that is arranged adjacent to a floating gate layer (or a charge trap layer) that is arranged adjacent to a tunneling layer (e.g., a thin oxide) that is arranged adjacent to a control gate layer (e.g., tungsten). The tunneling layer may have a thickness that is less than the thickness of the blocking layer.

Figure 4B:
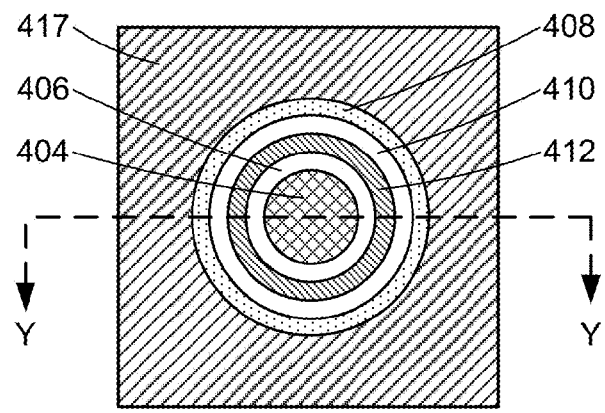
FIG. 4B depicts one embodiment of a cross-sectional view taken along line X-X of FIG. 4A.

FIG. 4B depicts one embodiment of a cross-sectional view taken along line X-X of FIG. 4A. As depicted, the inverted NAND string includes an inner core material layer 404 that is surrounded by the channel layer material 406 that is surrounded by the dielectric layer 412 that is surrounded by the floating gate material 410 that is surrounded by the tunneling layer material 408 that is surrounded by the control gate material layer 417. In one embodiment, FIG. 4A may depict a cross-sectional view taken along line Y-Y of FIG. 4B. In one embodiment, the inverted NAND string may be formed using a vertical cylindrical structure or a vertical tapered cylindrical structure. In this case, the dielectric material 412, floating gate material 410, tunneling layer material 408, and channel layer material 406 of the inverted NAND string may comprise vertical annular structures surrounding the core material layer 404. In another embodiment, the inverted NAND string may be formed using a vertical pillar structure or a vertical rectangular prism structure. More information regarding 3D NAND structures may be found in U.S. patent application Ser. No. 14/317,274, entitled "Three Dimensional NAND Device with Channel Contacting Conductive Source Line and Method of Making Thereof," filed Jun. 27, 2014.

FIG. 4C depicts another embodiment of a vertical NAND structure. The vertical NAND structure includes an inverted NAND string formed above the substrate 450 and oriented such that the inverted NAND string is orthogonal to the substrate 450. The inverted NAND string may be arranged within a vertical memory hole that is etched through alternating layers of control gate material (e.g., tungsten, nitride, or polysilicon) and inter-gate insulator material (e.g., oxide or silicon oxide). As depicted, the layers of control gate material include layers 444-445 and the layers of inter-gate insulator material include layers 446-447. The inter-gate insulator material layer 447 may be arranged above a source line layer 448 (e.g., doped polysilicon) that may be arranged above the substrate 450 (e.g., a silicon substrate). In some cases, a first word line may correspond with control gate layer 444 and a second word line may correspond with control gate layer 445.

In one embodiment, within the memory hole a tunneling layer material 438 (e.g., including a thin oxide), a charge trap layer material 440 (e.g., silicon nitride), a dielectric layer 442 (e.g., oxide), and a channel layer material 436 (e.g., undoped polysilicon) may be deposited within the memory hole and arranged in order to form the inverted NAND string. As depicted in FIG. 4C, the tunneling layer material 438 may be arranged within or inside of the memory hole. The tunneling layer material 438 may comprise a portion of a multi-layer dielectric stack such as an ONO dielectric stack, which includes alternating layers of silicon dioxide ("O") and silicon nitride ("N"). In some cases, a core material layer 434 (e.g., oxide) may be formed within the memory hole. In other cases, the core material layer 434 may be omitted. A bit line contact layer 432 may be formed at the top of the memory hole and connect to the channel layer material 436. The channel layer material 436 may connect to the source line layer 448 at the bottom of the memory hole. Thus, in this case, the bit line contact layer 432 connects to the inverted NAND string at the top of the memory hole and the source line contact layer 448 connects to the inverted NAND string at the bottom of the memory hole.

In one embodiment, the bit line contact layer 432 may comprise a material of a first conductivity type (e.g., n-type) and the source line contact layer 448 may comprise a material of a second conductivity type different from the first conductivity type (e.g., p-type). In one example, the bit line contact layer 432 may comprise an n-type material (e.g., n-type polysilicon) and the source line contact layer 448 may comprise a p-type material (e.g., p-type polysilicon). In another example, the bit line contact layer 432 may comprise a p-type material (e.g., p-type polysilicon) and the source line contact layer 448 may comprise an n-type material (e.g., n-type polysilicon). Thus, in some cases, the inverted NAND string may include an asymmetric source and drain that may be used to provide both an electron supply (via the n-type material) and a hole supply (via the p-type material) for memory operations (e.g., program, erase, and read operations) performed using the inverted NAND string. The memory operations may comprise n-channel operations and/or p-channel operations depending on the bias conditions applied to the inverted NAND string.

FIG. 4D depicts another embodiment of a vertical NAND structure. The vertical NAND structure includes an inverted NAND string formed above the substrate 480 and oriented such that the inverted NAND string is orthogonal to the substrate 480. The inverted NAND string may be arranged within a vertical memory hole that is etched through alternating layers of control gate material (e.g., tungsten, nitride, or polysilicon) and inter-gate insulator material (e.g., oxide or silicon oxide). As depicted, the layers of control gate material include layers 474-475 and the layers of inter-gate insulator material include layers 476-477. The inter-gate insulator material layer 477 may be arranged above a source line layer 478 (e.g., doped polysilicon) that may be arranged above the substrate 480 (e.g., a silicon substrate). In some cases, a first word line may correspond with control gate layer 474 and a second word line may correspond with control gate layer 475.

In one embodiment, within the memory hole a tunneling layer material 468 (e.g., including a thin oxide), a floating gate material 470 (e.g., polysilicon), a dielectric layer 472 (e.g., oxide), and a channel layer material 466 (e.g., undoped polysilicon) may be arranged in order to form the inverted NAND string. As depicted in FIG. 4D, the tunneling layer material 468 is arranged outside of the memory hole structure. The tunneling layer material 468 may comprise a portion of a multi-layer dielectric stack such as an ONO dielectric stack, which includes alternating layers of silicon dioxide ("O") and silicon nitride ("N"). In some cases, a core material layer 464 (e.g., oxide) may be formed within the memory hole. In other cases, the core material layer 464 may be omitted. A bit line contact layer 462 may be formed at the top of the memory hole and connect to the channel layer material 466. The channel layer material 466 may connect to the source line layer 478 at the bottom of the memory hole. Thus, in this case, the bit line contact layer 462 connects to the inverted NAND string at the top of the memory hole and the source line contact layer 478 connects to the inverted NAND string at the bottom of the memory hole.

In one embodiment, the bit line contact layer 462 may comprise a material of a first conductivity type (e.g., n-type) and the source line contact layer 478 may comprise a material of a second conductivity type different from the first conductivity type (e.g., p-type). In one example, the bit line contact layer 462 may comprise an n-type material (e.g., n-type polysilicon) and the source line contact layer 478 may comprise a p-type material (e.g., p-type polysilicon). In another example, the bit line contact layer 462 may comprise a p-type material and the source line contact layer 478 may comprise an n-type material (e.g., n-type polysilicon). Thus, in some cases, the inverted NAND string may include an asymmetric source and drain that may be used to provide both an electron supply (via the n-type material) and a hole supply (via the p-type material) for memory operations (e.g., program, erase, and read operations) performed using the inverted NAND string. The memory operations may comprise n-channel operations and/or p-channel operations depending on the bias conditions applied to the inverted NAND string.

FIG. 4E depicts one embodiment of a schematic representation of an inverted NAND string. As depicted, the inverted NAND string includes eight transistors in series between a source line (SL) and a bit line (BL). In some embodiments, the eight transistors may correspond with the eight transistors depicted in FIG. 4A, the eight transistors depicted in FIG. 4C, or the eight transistors depicted in FIG. 4D. The gate of the drain-side select transistor is connected to SGD and the gate of the source-side select transistor is connected to SGS. Between the drain-side select transistor and the source-side select transistors is six memory cell transistors connected in series and each connected to one of the word lines WL0 through WL5. Although the inverted NAND string depicted in FIG. 4E includes only six memory cell transistors, other inverted NAND strings may comprise two or more memory cell transistors in series (e.g., 32 memory cell transistors or 64 memory cell transistors). In one embodiment, a memory cell transistor within an inverted NAND string may comprise an inverted floating gate transistor with a tunneling layer (e.g., a tunneling oxide) between a floating gate of the inverted floating gate transistor and a control gate of the inverted floating gate transistor. The floating gate may comprise polysilicon. In another embodiment, a memory cell transistor within an inverted NAND string may comprise an inverted charge trap transistor with a tunneling layer (e.g., a tunneling oxide) between a charge trap layer of the inverted charge trap transistor and a control gate of the inverted charge trap transistor. The charge trap layer may comprise silicon nitride.

Figure 5:
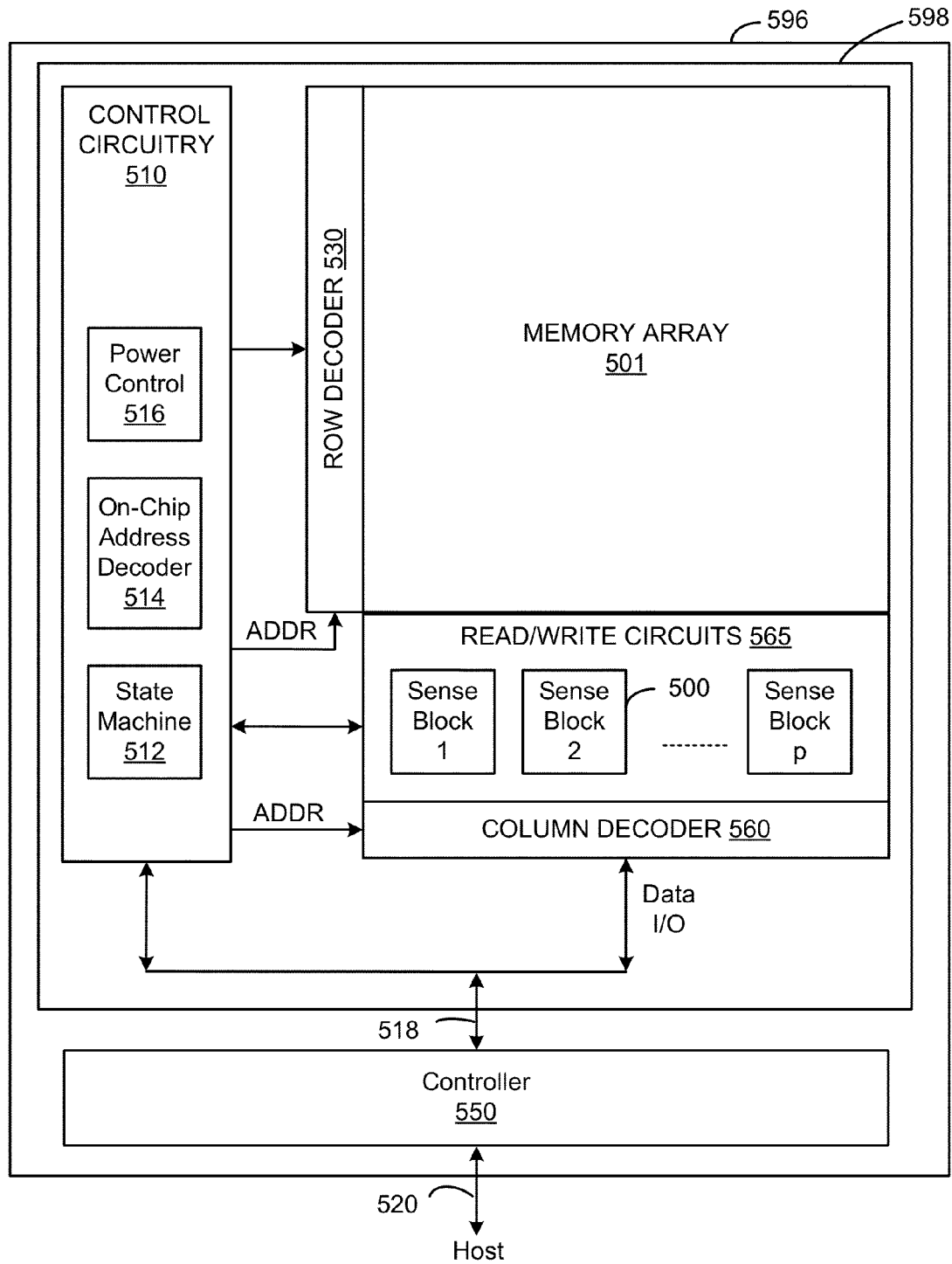
FIG. 5 depicts one embodiment of a non-volatile storage system.

FIG. 5 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 501 (e.g., a NAND flash memory array), control circuitry 510, row decoder 530, column decoder 560, and read/write circuits 565. In one embodiment, access to the memory array 501 by the various peripheral circuits (e.g., row decoders or column decoders) is implemented in a symmetric fashion, on opposite sides of the array, so that the densities of access lines and circuitry on each side are reduced by half. The memory array 501 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 501. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In one embodiment, a power control module 516 includes one or more charge pumps that may generate voltages greater than the supply voltage.

In some embodiments, one or more of the components (alone or in combination), other than memory array 501, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits or the one or more control circuits may perform or facilitate one or more memory array operations including erasing, programming, or reading operations.

In one embodiment, memory array 501 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 6:
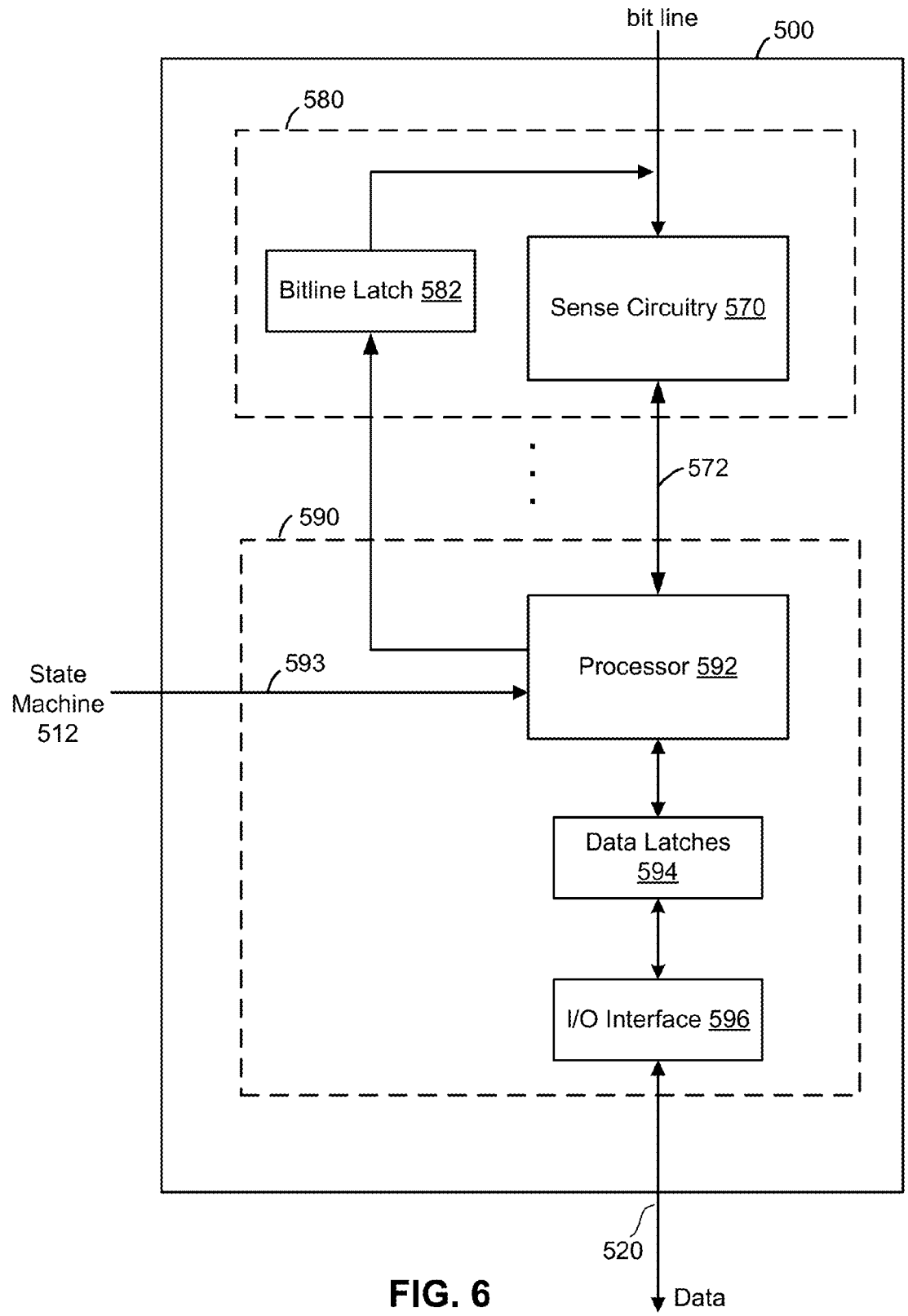
FIG. 6 depicts one embodiment of a sense block.

FIG. 6 depicts one embodiment of a sense block 500, such as sense block 500 in FIG. 5. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5. I/O interface 596 provides an interface between data latches 594 and the data bus 520.

During a read operation or other storage element sensing operation, a state machine, such as state machine 512 in FIG. 5, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

Figure 7A:
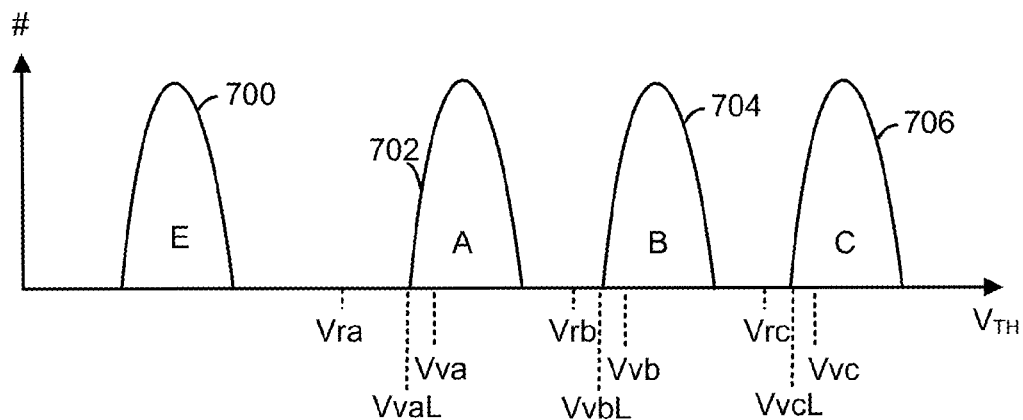
FIG. 7A depicts one embodiment of a set of threshold voltage distributions for a four-state memory device in which each storage element stores two bits of data.

FIG. 7A depicts one embodiment of a set of threshold voltage distributions for a four-state memory device in which each storage element stores two bits of data. A first threshold voltage (Vth) distribution 700 is provided for erased (E-state) storage elements. Three Vth distributions 702, 704 and 706 represent programmed states A, B and C, respectively. In one embodiment, the threshold voltages in the E-state and the threshold voltages in the A, B and C distributions are positive. In another embodiment, the threshold voltage distribution for the E-state is negative, while the threshold voltage distributions for the A-state, B-state and C-state distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

In one embodiment, known as full sequence programming, storage elements can be programmed from the E-state directly to any of the programmed states A, B or C. For example, a population of storage elements to be programmed may first be erased so that all storage elements in the population are in the E-state. A series of program pulses, such as depicted in FIG. 7F, may then be used to program storage elements directly into states A, B or C. While some storage elements are being programmed from the E-state to the A-state, other storage elements are being programmed from the E-state to the B-state and/or from the E-state to the C-state.

Another option is to use low and high verify levels for one or more data states. For example, VvaL and Vva are lower and higher verify levels, respectively, for the A-state, VvbL and Vvb are lower and higher verify levels, respectively, for the B-state, and VvcL and Vvc are lower and higher verify levels, respectively, for the C-state. In some cases, VvcL is not used since reduced programming precision may be acceptable for the highest state. During programming, when the Vth of a storage element which is being programmed to the A-state as a target state exceeds VvaL, the programming speed of the storage element is slowed down, in a slow programming mode, such as by raising the associated bit line voltage to a level, e.g., 0.6-0.8 V, which is between a nominal program or non-inhibit level, e.g., 0 V and a full inhibit level, e.g., 4-6 V. This provides greater accuracy by avoiding large step increases in threshold voltage. When the Vth reaches Vva, the storage element is locked out from further programming. Similarly, when the Vth of a storage element which is being programmed to the B-state as a target state exceeds VvbL, the programming speed of the storage element is slowed down, and when the Vth reaches Vvb, the storage element is locked out from further programming. Optionally, when the Vth of a storage element which is being programmed to the C-state as a target state exceeds VvcL, the programming speed of the storage element is slowed down, and when the Vth reaches Vvc, the storage element is locked out from further programming. This programming technique has been referred to as a quick pass write or dual verify technique. Note that, in one approach, dual verify levels are not used for the highest state since some overshoot is typically acceptable for that state.

Instead, the dual verify levels can be used for the programmed states, above the erased state, and below the highest state.

Figure 7B:
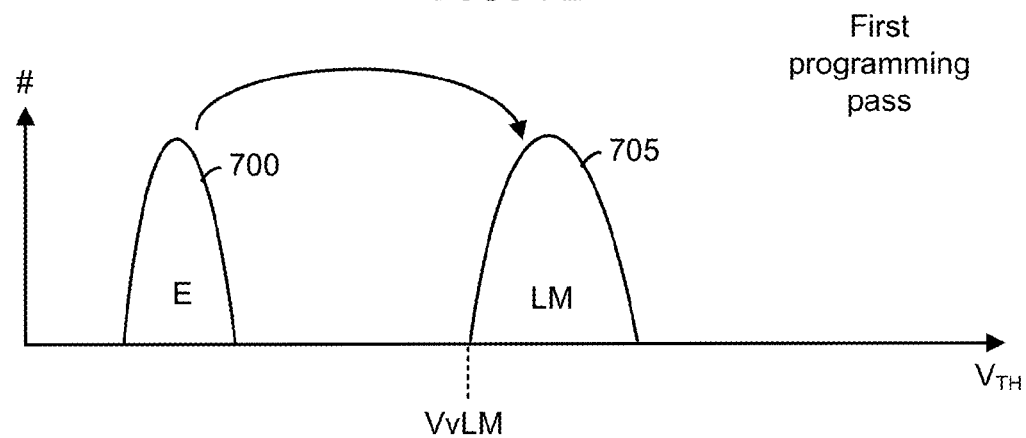
FIG. 7B depicts one embodiment of a first pass of a two-pass programming technique.

FIG. 7B depicts one embodiment of a first pass of a two-pass programming technique. In this example, a multi-state storage element stores data for two different pages: a lower page and an upper page. Four states are depicted by repeating the threshold voltage distributions 700, 702, 704 and 706 from FIG. 7A. These states, and the bits they represent, are: E-state (11), A-state (01), B-state (00) and C-state (10). For E-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

In the first programming pass, the lower page is programmed for a selected word line WLn. If the lower page is to remain data 1, then the storage element state remains at state E (distribution 700). If the data is to be programmed to 0, then the threshold voltage of the storage elements on WLn are raised such that the storage element is programmed to an intermediate (LM or lower-middle) state (distribution 705). In one embodiment, after a storage element is programmed from the E-state to the LM-state, its neighbor storage element on an adjacent word line WLn+1 in the NAND string will then be programmed with respect to its lower page in a respective first programming pass of the adjacent word line.

Figure 7C:
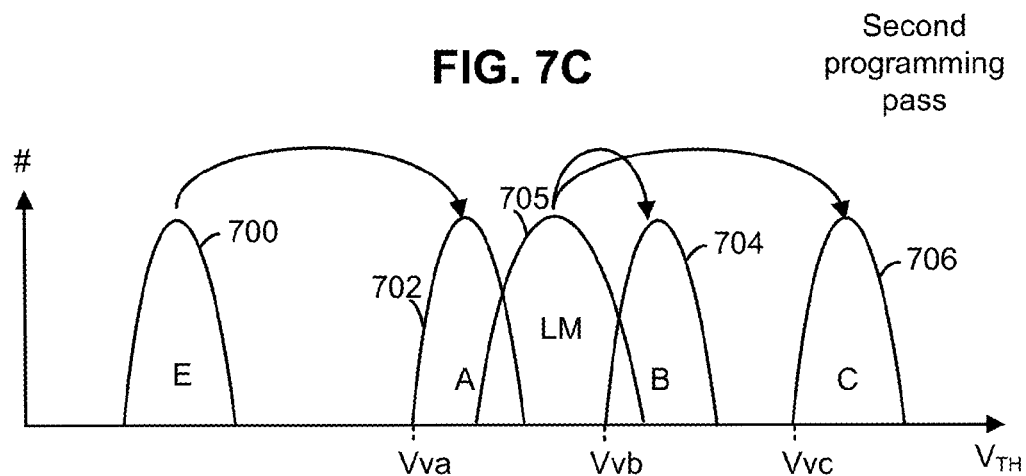
FIG. 7C depicts one embodiment of a second pass of the two-pass programming technique.

FIG. 7C depicts one embodiment of a second pass of the two-pass programming technique referred to in FIG. 7B. The A-state storage elements are programmed from the E-state distribution 700 to the A-state distribution 702, the B-state storage elements are programmed from the LM-state distribution 705 to the B-state distribution 704, and the C-state storage elements are programmed from the LM-state distribution 705 to the C-state distribution 706.

Figure 7D:
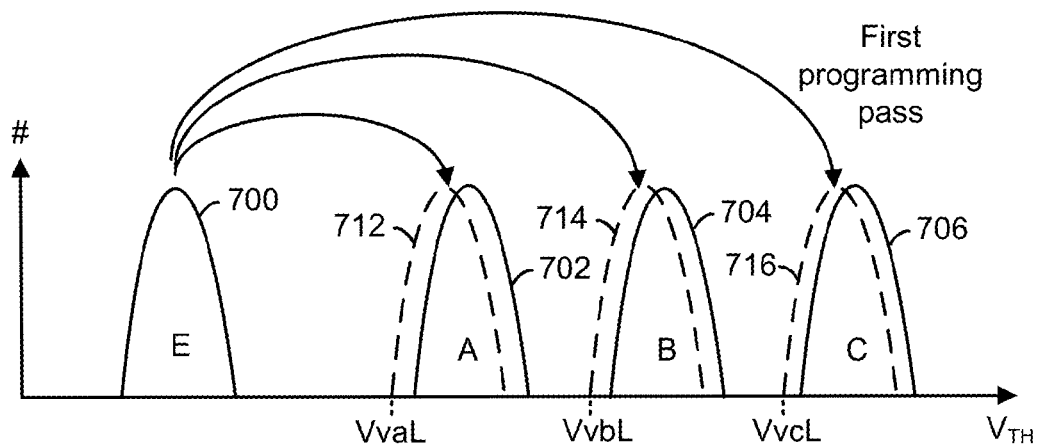
FIG. 7D depicts one embodiment of a first pass of another two-pass programming technique.

FIG. 7D depicts one embodiment of a first pass of another two-pass programming technique. In this example, referred to as foggy-fine (or course-fine) programming, the A-state, B-state and C-state storage elements are programmed from the E-state to distributions 712, 714 and 716, respectively, using lower verify levels VvaL, VvbL and VvcL, respectively. This is the foggy (or course) programming pass. A relatively large program voltage step size may be used, for instance, to quickly program the storage elements to the respective lower verify levels.

Figure 7E:
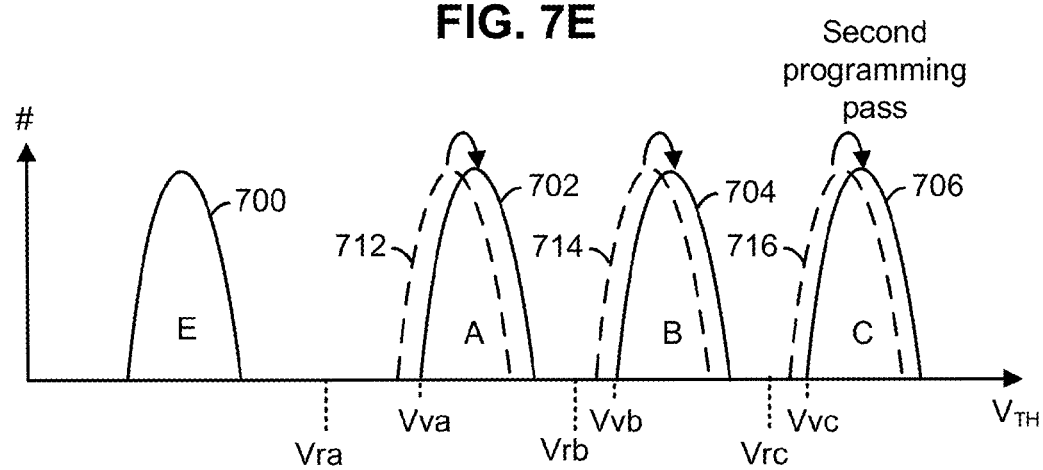
FIG. 7E depicts one embodiment of a second pass of the two-pass programming technique.
Figure 7F:
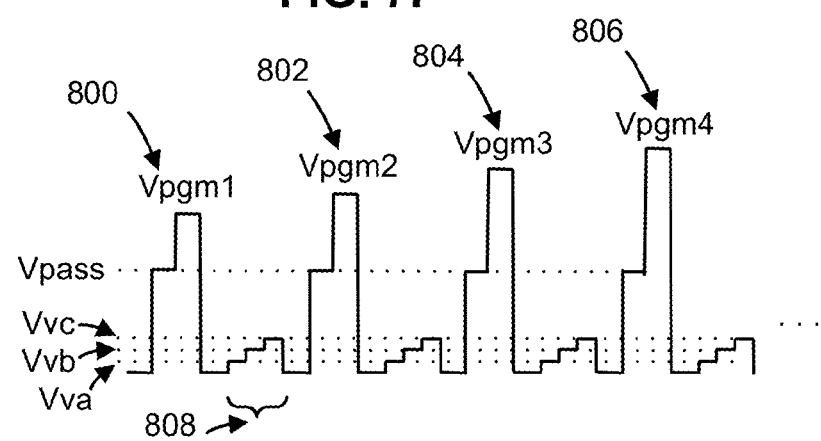
FIG. 7F depicts one embodiment of a series of program and verify pulses which are applied to a selected word line during a programming operation.

FIG. 7E depicts one embodiment of a second pass of the two-pass programming technique referred to in FIG. 7D. The A-state, B-state and C-state storage elements are programmed from the respective lower distributions to respective final distributions 702, 704 and 706, respectively, using the nominal, higher verify levels Vva, Vvb and Vvc, respectively. This is the fine programming pass. A relatively small program voltage step size may be used, for instance, to slowly program the storage elements to the respective final verify levels while avoiding a large overshoot.

Although the programming examples depict four data states and two pages of data, the concepts described herein may be applied to other implementations with more or fewer than four states and more or fewer than two pages. For example, memory devices may utilize eight or sixteen states per storage element. Moreover, in the example programming techniques discussed herein, the Vth of a storage element may be raised gradually as it is programmed to a target data state. However, programming techniques may be used in which the Vth of a storage element may be lowered gradually as it is programmed to a target data state.

FIG. 7F depicts one embodiment of a series of program and verify pulses which are applied to a selected word line during a programming operation. A programming operation may include multiple program-verify iterations, where each iteration applies one or more programming pulses followed by one or more verify pulses (e.g., to verify or determine the programming state or the programming level of a memory cell) to a selected word line. In one embodiment, the programming pulses are stepped up in successive iterations. Moreover, each programming pulse may include a first portion which has a pass voltage (Vpass) level, e.g., 6-8 V, followed by a second, highest amplitude portion at a programming voltage (Vpgm) level, e.g., 12-25 V. For example, as depicted in FIG. 7F, a first, second, third, and fourth programming pulses 800, 802, 804 and 806 have programming voltage levels of Vpgm1, Vpgm2, Vpgm3 and Vpgm4, respectively. One or more verify voltages 808, such as verify voltages Vva, Vvb and Vvc, may be provided after each programming pulse. In some cases, one or more initial programming pulses are not followed by verify pulses because it is not expected that any storage elements could have reached the lowest program state (e.g., A-state). Subsequently, in some cases, programming iterations may use verify pulses for the A-state, followed by programming iterations which use verify pulses for the A-states and B-states, followed by programming iterations which use verify pulses for the B-states and C-states.

Figure 8A:
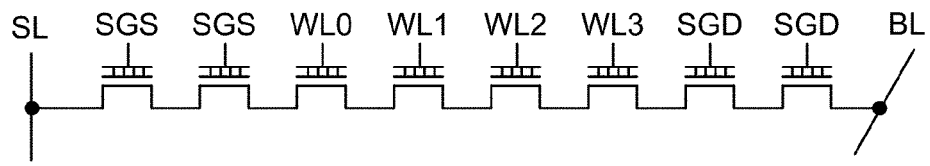
FIG. 8A depicts one embodiment of an inverted NAND string.

FIG. 8A depicts one embodiment of an inverted NAND string. As depicted, the inverted NAND string includes eight transistors in series between a source line (SL) and a bit line (BL). The gates of the two transistors closest to the bit line (the drain-side select transistors) are connected to SGD and the gates of the two transistors closest to the source line (the source-side select transistors) are connected to SGS. Between the drain-side select transistors and the source-side select transistors is four memory cell transistors connected in series and each connected to one of the word lines WL0 through WL3. Although the inverted NAND string depicted in FIG. 8A includes only four memory cell transistors, other inverted NAND strings may comprise two or more memory cell transistors in series (e.g., 32 memory cell transistors or 64 memory cell transistors). In one embodiment, a memory cell transistor within an inverted NAND string may comprise an inverted floating gate transistor with a tunneling oxide between a floating gate of the inverted floating gate transistor and a control gate of the inverted floating gate transistor. The floating gate may comprise polysilicon. In another embodiment, the memory cell transistor within an inverted NAND string may comprise an inverted charge trap transistor with a tunneling oxide between a charge trap layer of the inverted charge trap transistor and a control gate of the inverted charge trap transistor. The charge trap layer may comprise silicon nitride.

Figure 8B:
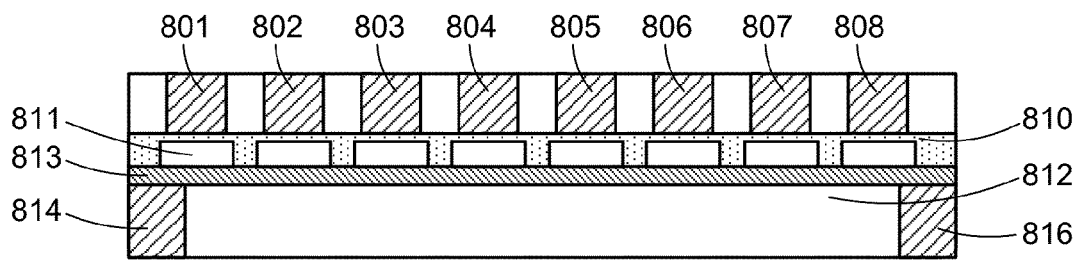
FIG. 8B depicts one embodiment of an implementation of the inverted NAND string depicted in FIG. 8A.

FIG. 8B depicts one embodiment of an implementation of the inverted NAND string depicted in FIG. 8A. As depicted, the eight control gates 801-808 may correspond with the eight transistors of the inverted NAND string in FIG. 8A. For example, control gates 801-802 may correspond with the two source-side select transistors, control gates 807-808 may correspond with the two drain-side select transistors, and control gates 803-806 may correspond with the four memory cell transistors. The tunneling oxide layer 801 may be arranged between the control gates 801-808 and the corresponding floating gates, such as floating gate 811. A blocking layer (or a dielectric layer) 813 may separate the floating gates from the channel layer 812. A bit line contact 816 may connect to a first side (e.g., the drain-side) of the inverted NAND string and a source line contact 814 may connect to a second side (e.g., the source-side) of the inverted NAND string. In one embodiment, the bit line contact 816 may comprise a material of a first conductivity type (e.g., n-type) and the source line contact 814 may comprise a material of a second conductivity type different from the first conductivity type (e.g., p-type). In one example, the bit line contact 816 may comprise an n-type material (e.g., n-type polysilicon) and the source line contact layer 814 may comprise a p-type material (e.g., p-type polysilicon). In another example, the bit line contact 816 may comprise a p-type material (e.g., p-type polysilicon) and the source line contact 814 may comprise an n-type material (e.g., n-type polysilicon).

Figure 8C:
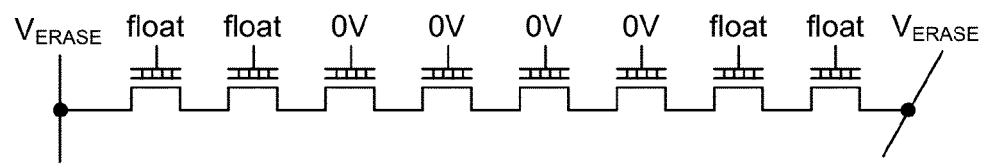
FIG. 8C depicts one embodiment of the inverted NAND string of FIG. 8A during an erase operation.

FIG. 8C depicts one embodiment of the inverted NAND string of FIG. 8A during an erase operation. As depicted, the two drain-side select gates have been floated, the two source-side select gates have been floated, the gates of the four memory cell transistors have been grounded (i.e., set to 0V), the source line has been set to $V_{ERASE}$, and the bit line has been set to $V_{ERASE}$. In some cases, $V_{ERASE}$ may be set to 20V or to another voltage that is greater than 0V and that is sufficient to generate an electric field that may transport electrons from the control gate onto the floating gate or into a charge trap layer. In this case, the erase operation increases the threshold voltage of a memory cell transistor (rather than lowering the threshold voltage as would occur during a traditional NAND erase operation). During the erase operation, the threshold voltages of the four memory cell transistors may be programmed into the Erase state (E-state) distribution 820 in FIG. 8D. In some cases, soft programming may be used to tighten the Erase state distribution 820. During soft programming, one or more erase operations may be followed by one or more erase verify operations.

Figure 8D:
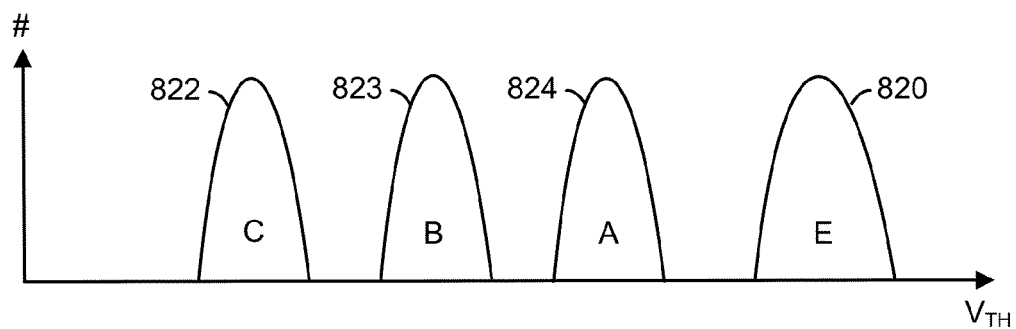
FIG. 8D depicts one embodiment of a set of threshold voltage distributions.

FIG. 8D depicts one embodiment of a set of threshold voltage distributions. A first threshold voltage distribution 822 corresponds with a first programming state (i.e., the C-state), a second threshold voltage distribution 823 corresponds with a second programming state (i.e., the B-state), a third threshold voltage distribution 824 corresponds with a third programming state (i.e., the A-state), and a fourth threshold voltage distribution 820 corresponds with an erased state (i.e., the E-state). As depicted, the E-state distribution corresponds with a range of threshold voltages that are greater than the threshold voltages of the first threshold voltage distribution 822, the second threshold voltage distribution 823, and the third threshold voltage distribution 824. In one embodiment, the threshold voltages in the E-state and the threshold voltages in the A, B and C distributions are all positive. In another embodiment, the threshold voltage distribution for the C-state is negative, while the threshold voltage distributions for the B-state, A-state and E-state distributions are positive.

Figure 8E:
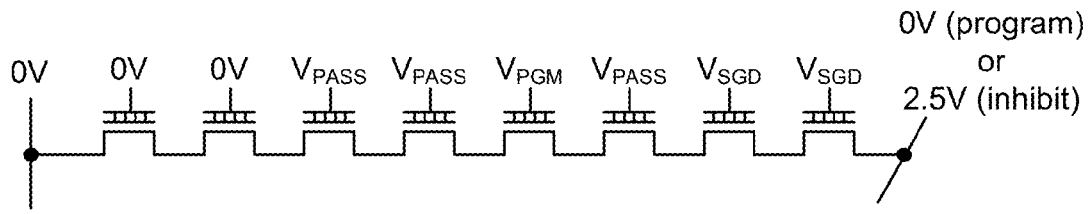
FIG. 8E depicts one embodiment of the inverted NAND string of FIG. 8A during a programming operation.

FIG. 8E depicts one embodiment of the inverted NAND string of FIG. 8A during a programming operation. As depicted, the two source-side select gates have been set to 0V, the two drain-side select gates have been set to $V_{SGD}$, the source line has been to set 0V, the bit line has been set to 0V (when programming a memory cell), a gate of the memory cell transistor associated with word line WL2 in FIG. 8A (i.e., the control gate of the selected memory cell) has been set to $V_{PGM}$, and the gates of the other three memory cell transistors associated with word lines WL0-WL1 and WL3 have been set to $V_{PASS}$. The pass voltage, $V_{PASS}$, may be less than the programming voltage, $V_{PGM}$. In some cases, $V_{SGD}$ may be set to 2V, $V_{PASS}$ may be set to 6V, and $V_{PGM}$ may be set to 20V or to another voltage that is sufficient to generate an electric field that may transport electrons from a floating gate or from a charge trap layer associated with the selected memory cell transistor. In this case, the programming operation reduces the threshold voltage of the selected memory cell transistor (rather than increasing the threshold voltage as would occur during a traditional NAND programming operation). During the programming operation, the threshold voltage of the selected memory cell transistor may be programmed (or lowered) into one of the A-state, B-state, or C-state distributions in FIG. 8D.

Figure 8F:
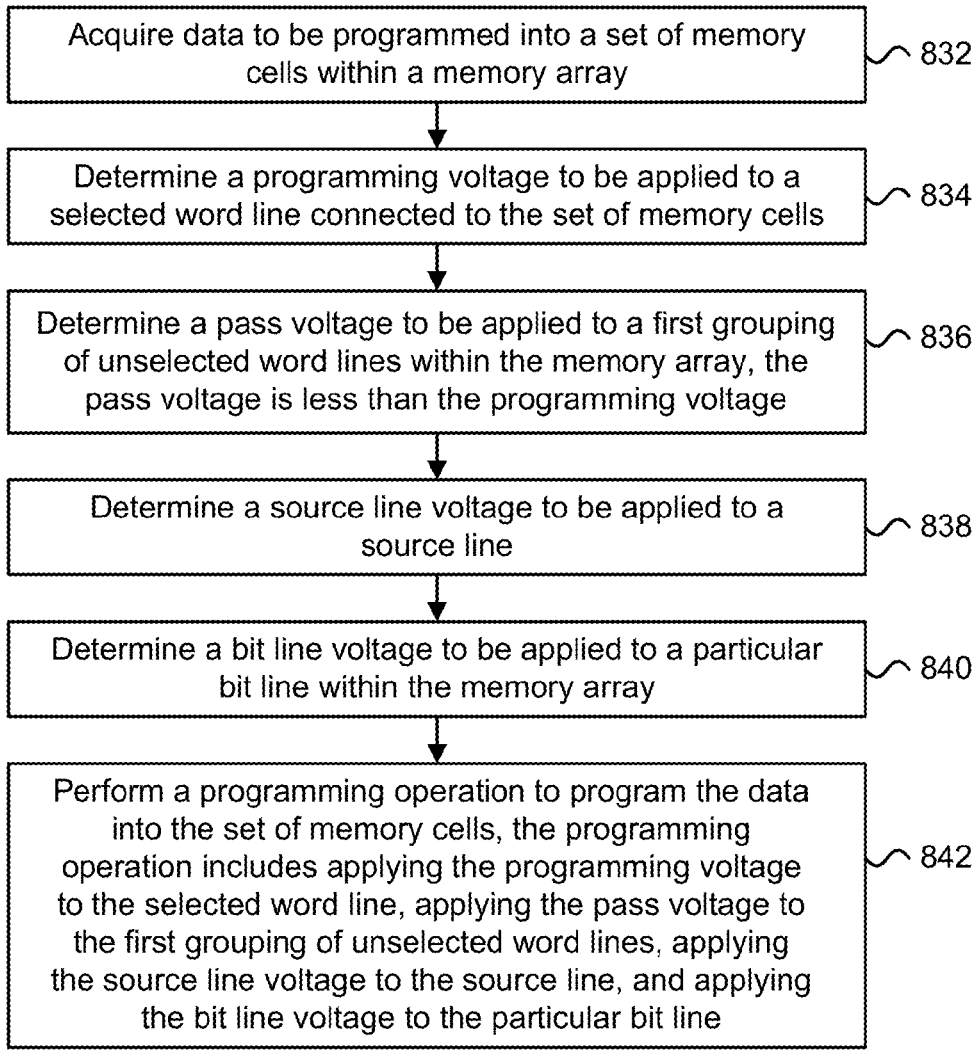
FIG. 8F is a flowchart describing one embodiment of a process for performing a programming operation.

FIG. 8F is a flowchart describing one embodiment of a process for performing a programming operation. In one embodiment, the process of FIG. 8F may be performed by a non-volatile storage system, such as non-volatile storage system 596 in FIG. 5.

In step 832, data to be programmed into a set of memory cells within a memory array is acquired. The memory array may include an inverted NAND structure. The inverted NAND structure may comprise an inverted 2D floating gate NAND structure, a vertical or 3D inverted floating gate NAND structure, an inverted 2D charge trap NAND structure, or a vertical or 3D inverted charge trap NAND structure. In step 834, a programming voltage to be applied to a selected word line connected to the set of memory cells is determined. In step 836, a pass voltage to be applied to a first grouping of unselected word lines within the memory array is determined. The pass voltage may be less than the programming voltage. In one example, the programming voltage may be 15-20V and the pass voltage may be 6-8V. In one embodiment, the first grouping of unselected word lines may correspond with each unselected memory cell transistor within an inverted NAND string. In another embodiment, the first grouping of unselected word lines may include a first unselected word line that is adjacent to the selected word line (e.g., if the selected word line is WL2, then the first unselected word line may comprise WL1 or WL3).

In step 838, a source line voltage to be applied to a source line is determined. In step 840, a bit line voltage to be applied to a particular bit line within the memory array is determined. The source line may be connected to a first end (e.g., the source-side end) of an inverted NAND string and the particular bit line may be connected to a second end (e.g., the drain-side end) of the inverted NAND string. In one embodiment, if a memory cell transistor of the inverted NAND string is to be programmed, then the bit line voltage may be set to 0V or to another voltage to enable programming of the memory cell transistor. Otherwise, if the memory cell transistor of the inverted NAND string is to be program inhibited (i.e., not programmed), then the bit line voltage may be set to VDD (e.g., 2.5V) or to another voltage to prevent programming of the memory cell transistor.

In step 842, a programming operation to program the data into the set of memory cells is performed. The programming operation may include applying the programming voltage to the selected word line, applying the pass voltage to the first grouping of unselected word lines, applying the source line voltage to the source line, and applying the bit line voltage to the particular bit line. In one embodiment, during the programming operation, the source line may be set to 0V, the particular bit line may be set to 0V (to program the selected memory cell transistor), the selected word line may be set to $V_{PGM}$ (e.g., 20V), and each of the unselected word lines may be set to $V_{PASS}$ (e.g., 6V). In another embodiment, during the programming operation, the source line may be set to 0V, the particular bit line may be set to 2.5V (to prevent programming of the selected memory cell transistor), the selected word line may be set to $V_{PGM}$ (e.g., 15V), and the unselected word lines that are directly adjacent to the selected word line may be set to $V_{PASS}$ (e.g., 6V).

Figure 8G:
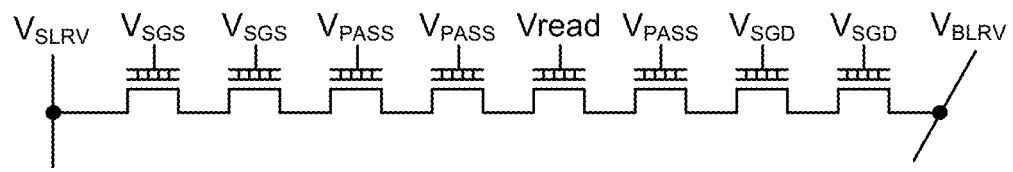
FIG. 8G depicts one embodiment of the inverted NAND string of FIG. 8A during a read operation.

FIG. 8G depicts one embodiment of the inverted NAND string of FIG. 8A during a read operation. In one embodiment, the read operation may comprise a program verify operation. The read operation may comprise a p-channel read operation. As depicted, the two source-side select gates have been set to $V_{SGS}$, the two drain-side select gates have been set to $V_{SGD}$, a gate of the memory cell transistor associated with word line WL2 in FIG. 8A (i.e., the control gate of the selected memory cell to be read) has been set to Vread, and the gates of the other three memory cell transistors associated with word lines WL0-WL1 and WL3 have been set to $V_{PASS}$. $V_{PASS}$ (e.g., 0V or −2V) may be less than Vread (e.g., 5V or 7V). In some cases, $V_{PASS}$ may be less than 0V or a negative voltage (due to the p-channel read operation). $V_{SLRV}$ may be applied to the source line (e.g., 2V or a voltage that is greater than the voltage applied to the bit line), $V_{BLRV}$ may be applied to the bit line (e.g., 0V), and Vread (the read voltage applied to the selected control gate) may be set to the appropriate read voltage to determine the threshold voltage of the selected memory cell transistor (e.g., a voltage corresponding with the CV or BV in FIG. 8H). In some cases, $V_{SGD}$ may be set to −2V, $V_{SGS}$ may be set to −2V, $V_{PASS}$ may be set to −2V, and Vread may be set to AV, BV, or CV (e.g., 3V) in FIG. 8H.

Figure 8H:
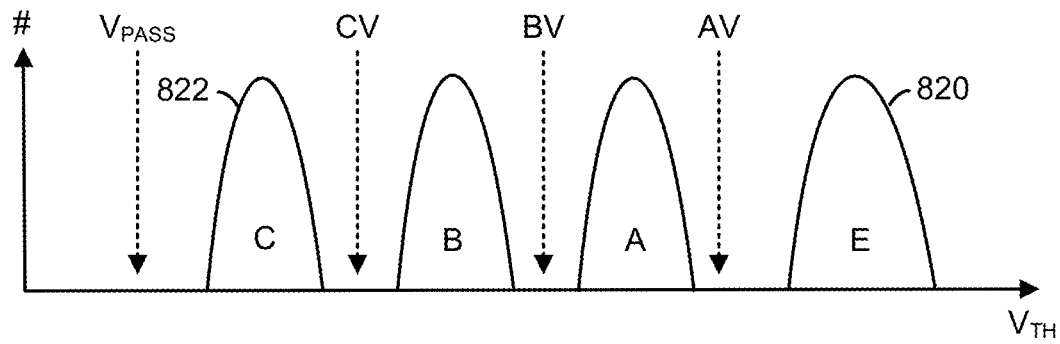
FIGS. 8H and 8J depict embodiments of the set of threshold voltage distributions depicted FIG. 8D.

FIG. 8H depicts one embodiment of the set of threshold voltage distributions depicted FIG. 8D. As depicted, the $V_{PASS}$ voltage is set to a voltage that is less than any of the threshold voltages within the A-state, B-state, or C-state distributions. A first program verify voltage (CV) is positioned between the C-state distribution 822 and the B-state distribution. A second program verify voltage (BV) is positioned between the B-state distribution and the A-state distribution. A third program verify voltage (AV) is positioned between the A-state distribution and the E-state distribution 820.

Figure 8I:
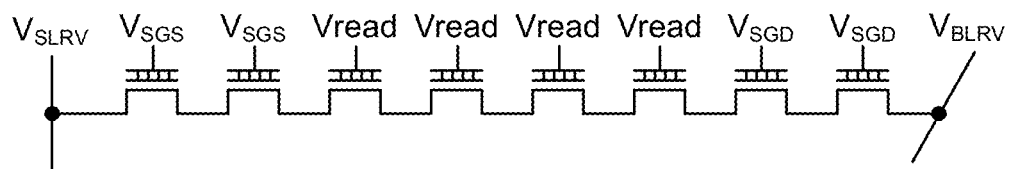
FIG. 8I depicts one embodiment of the inverted NAND string of FIG. 8A during an erase verify operation.

FIG. 8I depicts one embodiment of the inverted NAND string of FIG. 8A during an erase verify operation. In one embodiment, the erase verify operation may comprise a verification operation performed after an erase operation has been performed. As depicted, the two source-side select gates have been set to $V_{SGS}$, the two drain-side select gates have been set to $V_{SGD}$, and the four memory cell transistors associated with word lines WL0-WL3 have been set to Vread. Vread (e.g., 12) may be greater than the highest threshold voltage within the A-state distribution. In some cases, $V_{SLRV}$ may be applied to the source line (e.g., 2V or a voltage that is greater than the voltage applied to the bit line), $V_{BLRV}$ may be applied to the bit line (e.g., 0V), and Vread may be set to the appropriate read voltage to determine the lowest threshold voltage of the memory cell transistors in the inverted NAND string. In this case, the inverted NAND string will conduct when each of the threshold voltages of the memory cells transistors is greater than the erase verify voltage. In one embodiment, $V_{SGD}$ may be set to −2V, $V_{SGS}$ may be set to −2V, $V_{SLRV}$ may be set to 2V, $V_{BLRV}$ may be set to 0V, and Vread may be set to a voltage (e.g., EV_H in FIG. 8J) that is greater than any of the threshold voltages within the A-state, B-state, and C-state distributions.

Figure 8J:
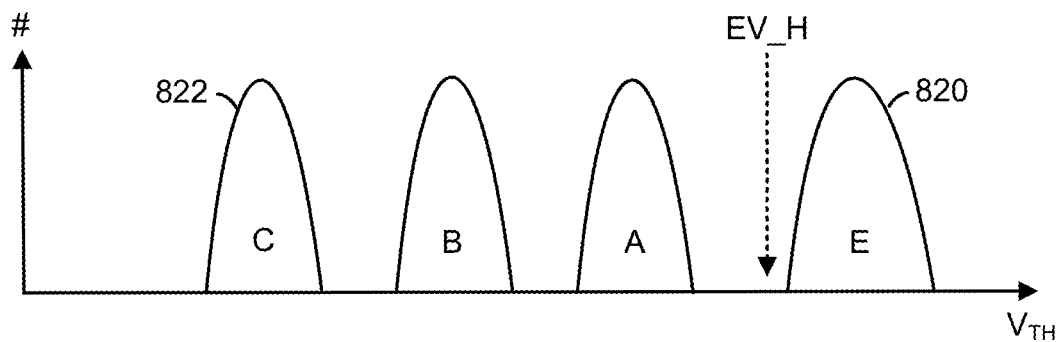

FIG. 8J depicts one embodiment of the set of threshold voltage distributions depicted FIG. 8D. As depicted, the Vread voltage during the erase verify operation (EV_H) is set to a voltage that is greater than any of the threshold voltages within the A-state, B-state, and C-state distributions. The erase verify voltage (EV_H) is positioned between the A-state distribution and the E-state distribution 820.

Figure 8K:
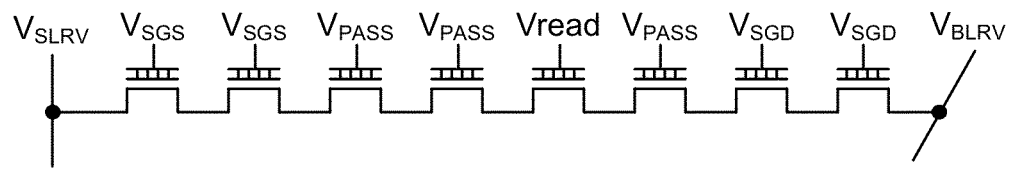
FIG. 8K depicts one embodiment of the inverted NAND string of FIG. 8A during a read operation.

FIG. 8K depicts one embodiment of the inverted NAND string of FIG. 8A during a read operation. In one embodiment, the read operation may comprise a program verify operation. The read operation may comprise an n-channel read operation. As depicted, the two source-side select gates have been set to $V_{SGS}$, the two drain-side select gates have been set to $V_{SGD}$, a gate of the memory cell transistor associated with word line WL2 in FIG. 8A (i.e., the control gate of the selected memory cell to be read) has been set to Vread, and the gates of the other three memory cell transistors associated with word lines WL0-WL1 and WL3 have been set to $V_{PASS}$. $V_{PASS}$ (e.g., 15V) may be greater than Vread (e.g., 5V or 7V). In some cases, $V_{PASS}$ may be greater than the highest threshold voltage within the E-state distribution. $V_{SLRV}$ may be applied to the source line (e.g., 0V or a voltage that is less than the voltage applied to the bit line), $V_{BLRV}$ may be applied to the bit line (e.g., 2V or VDD), and Vread (the read voltage applied to the selected control gate) may be set to the appropriate read voltage to determine the threshold voltage of the selected memory cell transistor (e.g., a voltage corresponding with the verify voltages CV, BV, or AV in FIG. 8L). In some cases, $V_{SGD}$ may be set to 15V, $V_{SGS}$ may be set to 15V, $V_{PASS}$ may be set to 15V, and Vread may be set to AV, BV, or CV (e.g., 3V) in FIG. 8L.

Figure 8L:
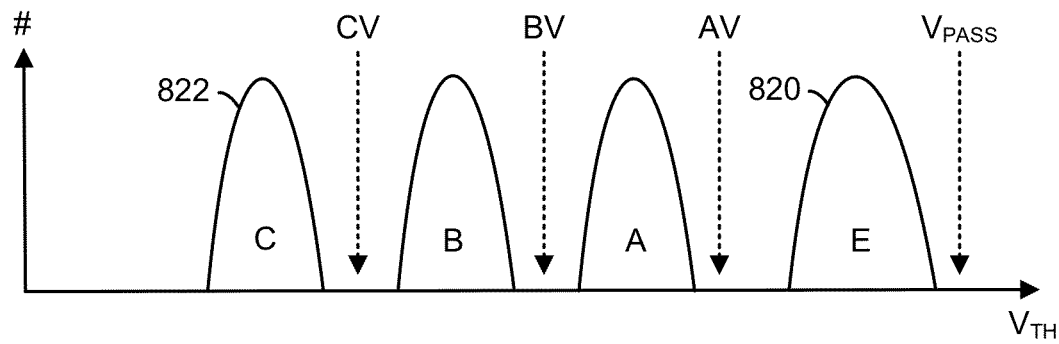
FIG. 8L depicts one embodiment of the set of threshold voltage distributions depicted FIG. 8D.

FIG. 8L depicts one embodiment of the set of threshold voltage distributions depicted FIG. 8D. As depicted, the $V_{PASS}$ voltage is set to a voltage that is greater than any of the threshold voltages within the A, B, C, and erase state distributions. A first program verify voltage (CV) is positioned between the C-state distribution 822 and the B-state distribution. A second program verify voltage (BV) is positioned between the B-state distribution and the A-state distribution. A third program verify voltage (AV) is positioned between the A-state distribution and the E-state distribution 820. In this case, as the $V_{PASS}$ voltage is set to a voltage that is greater than any of the threshold voltages within the A, B, C, and erase state distributions, soft programming may be used to limit the width of the E-state distribution 820 in order to lower the $V_{PASS}$ voltage applied during an n-channel read operation.

Figure 8M:
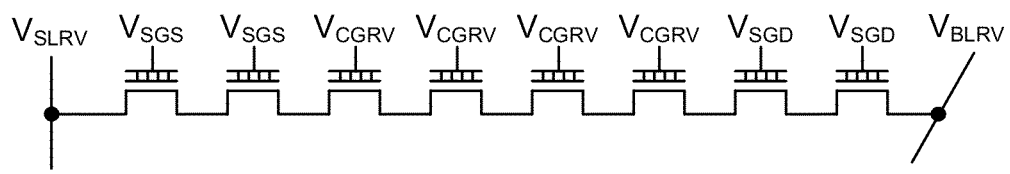
FIG. 8M depicts one embodiment of the inverted NAND string of FIG. 8A during an erase verify operation.

FIG. 8M depicts one embodiment of the inverted NAND string of FIG. 8A during an erase verify operation. In one embodiment, the erase verify operation may comprise a verification operation performed after an erase operation or during a soft programming operation. As depicted, the two source-side select gates have been set to $V_{SGS}$, the two drain-side select gates have been set to $V_{SGD}$, and the gates of the four memory cell transistors associated with word lines WL0-WL3 have been set to $V_{CGRV}$. In some cases, $V_{SLRV}$ may be applied to the source line (e.g., 2V or a voltage that is greater than the voltage applied to the bit line), $V_{BLRV}$ may be applied to the bit line (e.g., 0V), and $V_{CGRV}$ (e.g., 15) may be set to the appropriate read voltage to determine the highest threshold voltage of the memory cell transistors. In one embodiment, $V_{SGD}$ may be set to −2V, $V_{SGS}$ may be set to −2V, $V_{SLRV}$ may be set to 2V, $V_{BLRV}$ may be set to 0V, and $V_{CGRV}$ may be set to a voltage (e.g., EV_L in FIG. 8N) that is greater than any of the threshold voltages within the A-state, B-state, and C-state distributions.

Figure 8N:
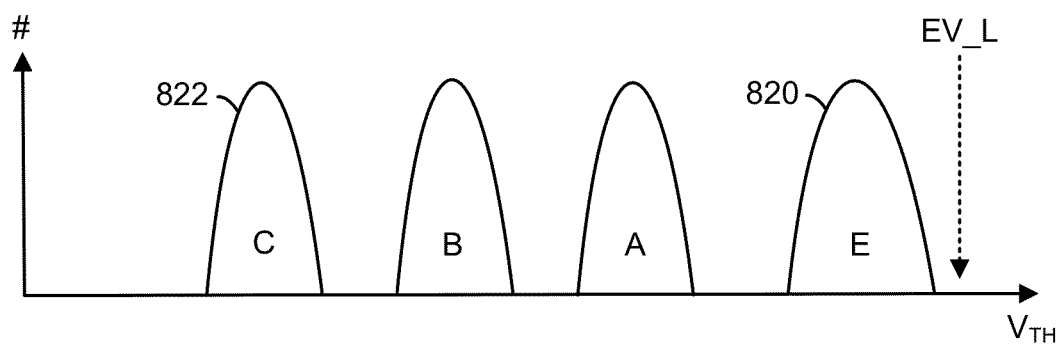
FIG. 8N depicts one embodiment of the set of threshold voltage distributions depicted FIG. 8D.

FIG. 8N depicts one embodiment of the set of threshold voltage distributions depicted FIG. 8D. As depicted, the Vread voltage during the erase verify operation (EV_L) is set to a voltage that is greater than any of the threshold voltages within the A, B, C and erase state distributions. The erase verify voltage (EV_L) is positioned at a voltage that is greater than the targeted E-state distribution 820.

Figures 8O, 8P:
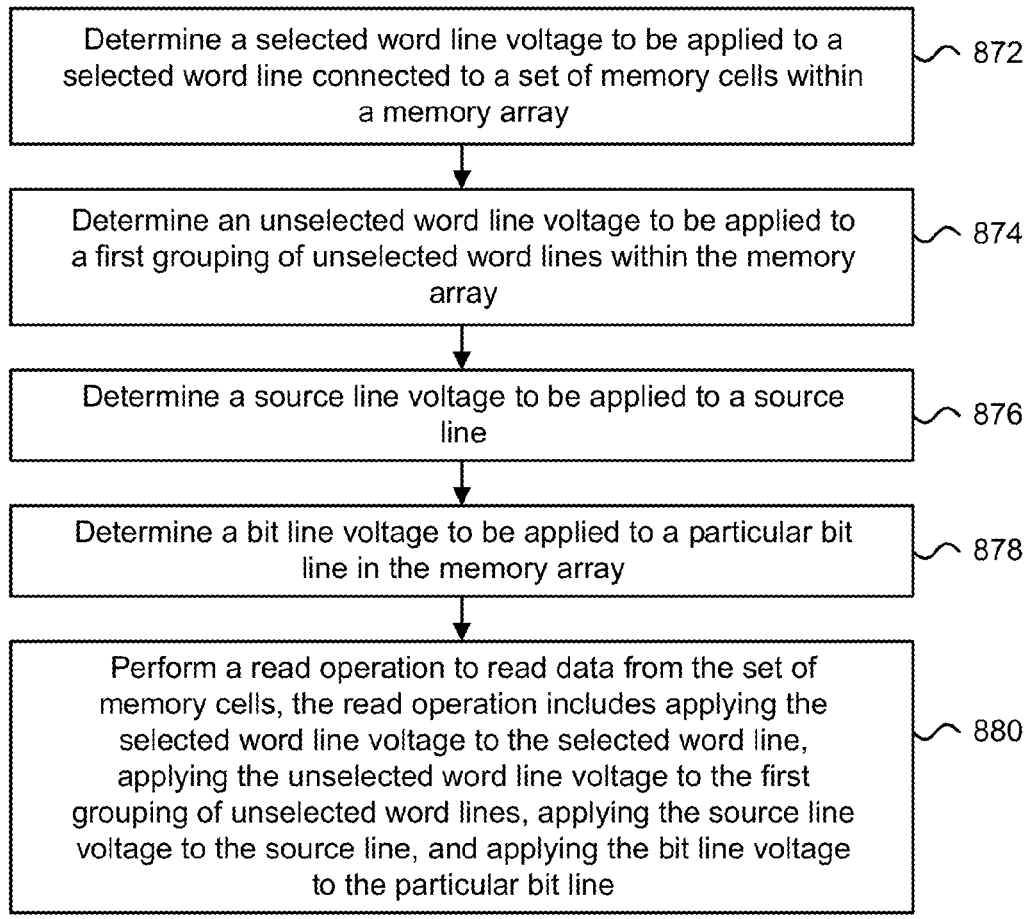
FIG. 8O is a flowchart describing one embodiment of a process for performing a read operation.
FIG. 8P depicts one embodiment of a table showing various operating modes for an inverted NAND string.

FIG. 8O is a flowchart describing one embodiment of a process for performing a read operation. In one embodiment, the process of FIG. 8O may be performed by a non-volatile storage system, such as non-volatile storage system 596 in FIG. 5.

In step 872, a selected word line voltage to be applied to a selected word line connected to a set of memory cells within the memory array is determined. In step 874, an unselected word line voltage to be applied to a first grouping of unselected word lines within the memory array is determined. The memory array may include an inverted NAND structure. The inverted NAND structure may comprise an inverted 2D floating gate NAND structure, a vertical inverted floating gate NAND structure, an inverted 2D charge trap NAND structure, or a vertical inverted charge trap NAND structure. In one embodiment, the unselected word line voltage may be greater than the selected word line voltage if an n-channel read operation or an n-channel program verify operation is to be performed. In another embodiment, the unselected word line voltage may be less than the selected word line voltage if a p-channel read operation or a p-channel program verify operation is to be performed.

In step 876, a source line voltage to be applied to a source line is determined. In step 878, a bit line voltage to be applied to a particular bit line in the memory array is determined. In one embodiment, if an n-channel read operation or an n-channel program verify operation is performed, then the bit line voltage may be greater than the source line voltage. In one example, the source line voltage may be set to 0V and the bit line voltage may be set to 2V. In another embodiment, if a p-channel read operation or a p-channel program verify operation is performed, then the bit line voltage may be less than the source line voltage. In one example, the source line voltage may be set to 2V and the bit line voltage may be set to 0V.

In step 880, a read operation to read data from the set of memory cells is performed. The read operation includes applying the selected word line voltage to the selected word line, applying the unselected word line voltage to the first grouping of unselected word lines, applying the source line voltage to the source line, and applying the bit line voltage to the particular bit line. In one embodiment, during an n-channel read operation, the source line may be set to 0V, the particular bit line may be set to 2V, the selected word line may be set to Vread (e.g., 7V), and each of the unselected word lines may be set to $V_{PASS}$ (e.g., 15V). In another embodiment, during a p-channel read operation, the source line may be set to 2V, the particular bit line may be set to 0V, the selected word line may be set to Vread (e.g., 7V), and the unselected word lines that are directly adjacent to the selected word line may be set to $V_{PASS}$ (e.g., –2V).

FIG. 8P depicts one embodiment of a table showing a first operation mode (Operation Mode I) and a second operation mode (Operation Mode II). In the first operation mode, an inverted floating gate transistor (or an inverted charge trap transistor) may be programmed into one of a plurality of programming states, such as the A-state in FIG. 8D. In this case, the erased state (E-state) may comprise a range of threshold voltages that are greater than any of the other threshold voltages within the programming state distributions. In the first operation mode, program verify operations may comprise p-channel read operations and erase verify operations (or block-level erase verify operations) may comprise p-channel read operations. As during p-channel read operations, the pass voltage ($V_{PASS}$) applied to unselected word lines is positioned well below the E-state distribution, soft programming may be omitted in some cases.

In the second operation mode, an inverted floating gate transistor (or an inverted charge trap transistor) may be programmed into one of the plurality of programming states, such as the B-state in FIG. 8D. In this case, the erased state (E-state) may comprise a range of threshold voltages that are greater than any of the other threshold voltages within the programming state distributions. In the second operation mode, program verify operations may comprise n-channel read operations and erase verify operations (or block-level erase verify operations) may comprise p-channel read operations. As during n-channel read operations, the pass voltage ($V_{PASS}$) applied to unselected word lines is positioned above the E-state distribution, soft programming may be performed to tighten the E-state distribution and to lower the pass voltage applied to the unselected word lines during program verify operations or n-channel read operations.

One embodiment of the disclosed technology includes determining a selected word line voltage to be applied to a selected word line within a memory array. The memory array includes an inverted NAND string. The inverted NAND string includes a first memory cell transistor. The selected word line is connected to a control gate of the first memory cell transistor. The method further comprises determining an unselected word line voltage to be applied to a first unselected word line within the memory array. The inverted NAND string includes a second memory cell transistor. The first unselected word line is connected to a control gate of the second memory cell transistor. The method further comprises determining a source line voltage to be applied to a first diffusion region at a source-side end of the inverted NAND string, determining a bit line voltage to be applied to a second diffusion region at a drain-side end of the inverted NAND string, and performing a read operation to read data from the first memory cell transistor. The read operation includes applying the selected word line voltage to the selected word line, applying the unselected word line voltage to the first unselected word line, applying the source line voltage to the first diffusion region of the inverted NAND string, and applying the bit line voltage to the second diffusion region of the inverted NAND string. The first diffusion region is of a different conductivity type than the second diffusion region.

In some cases, the first diffusion region may comprise a p-type source diffusion and the second diffusion region comprises an n-type drain diffusion. In some cases, the read operation may comprise a p-channel read operation in which the unselected word line voltage is less than the selected word line voltage and the bit line voltage is less than the source line voltage.

In some cases, the inverted NAND string may include a string of inverted floating gate transistors in which the string of inverted floating gate transistors includes an inverted floating gate transistor. The inverted floating gate transistor includes a tunneling layer between a floating gate of the inverted floating gate transistor and a control gate of the inverted floating gate transistor.

One embodiment of the disclosed technology includes a memory array and one or more control circuits in communication with the memory array. The memory array includes an inverted NAND string. The inverted NAND string includes a first memory cell transistor in series with a second memory cell transistor. The one or more control circuits configured to determine a selected word line voltage to be applied to a selected word line within the memory array. The selected word line is connected to a control gate of the first memory cell transistor. The one or more control circuits configured to determine an unselected word line voltage to be applied to a first unselected word line within the memory array. The first unselected word line is connected to a control gate of the second memory cell transistor. The one or more control circuits configured to determine a source line voltage to be applied to a first diffusion at a source-side end of the inverted NAND string and configured to determine a bit line voltage to be applied to a second diffusion at a drain-side end of the inverted NAND string. The one or more control circuits configured to initiate a read operation to read data from the first memory cell transistor. The one or more control circuits configured to cause the selected word line voltage to be applied to the selected word line during the read operation and the unselected word line voltage to be applied to the first unselected word line during the read operation. The one or more control circuits configured to cause the source line voltage to be applied to the first diffusion of the inverted NAND string during the read operation and the bit line voltage to be applied to the second diffusion of the inverted NAND string during the read operation. The first diffusion is of a different conductivity type than the second diffusion.

One embodiment of the disclosed technology includes acquiring data to be programmed into a first memory cell transistor of an inverted NAND string. The first memory cell transistor includes a tunneling layer that is arranged adjacent to a control gate of the first memory cell transistor. The method further comprises determining a programming voltage to be applied to a selected word line connected to the control gate of the first memory cell transistor and determining a pass voltage to be applied to a first unselected word line connected to a control gate of a second memory cell transistor of the inverted NAND string. The pass voltage is less than the programming voltage. The method further comprises performing a programming operation to program the data into the first memory cell transistor. The programming operation includes applying the programming voltage to the selected word line and applying the pass voltage to the first unselected word line. The programming operation causes a threshold voltage of the first memory cell transistor to be reduced.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for operating a non-volatile memory, comprising:
   determining a selected word line voltage to be applied to a selected word line within a memory array, the memory array includes an inverted NAND string, the inverted NAND string includes a first memory cell transistor, the selected word line is connected to a control gate of the first memory cell transistor;
   determining an unselected word line voltage to be applied to a first unselected word line within the memory array, the inverted NAND string includes a second memory cell transistor, the first unselected word line is connected to a control gate of the second memory cell transistor;
   determining a source line voltage to be applied to a first diffusion region at a source-side end of the inverted NAND string;
   determining a bit line voltage to be applied to a second diffusion region at a drain-side end of the inverted NAND string; and
   performing a read operation to read data from the first memory cell transistor, the read operation includes applying the selected word line voltage to the selected word line, applying the unselected word line voltage to the first unselected word line, applying the source line voltage to the first diffusion region of the inverted NAND string, and applying the bit line voltage to the second diffusion region of the inverted NAND string, the first diffusion region is of a different conductivity type than the second diffusion region.

2. The method of claim 1, wherein:
   the first diffusion region comprises a p-type source diffusion and the second diffusion region comprises an n-type drain diffusion.

3. The method of claim 1, wherein:
   the read operation comprises a p-channel read operation, the unselected word line voltage is less than the selected word line voltage, the bit line voltage is less than the source line voltage.

4. The method of claim 1, wherein:
   the read operation comprises an n-channel read operation, the unselected word line voltage is greater than the selected word line voltage, the bit line voltage is greater than the source line voltage.

5. The method of claim 1, wherein:
   the inverted NAND string includes a string of inverted floating gate transistors.

6. The method of claim 5, wherein:
   the string of inverted floating gate transistors includes an inverted floating gate transistor, the inverted floating gate transistor includes a tunneling layer between a floating gate of the inverted floating gate transistor and a control gate of the inverted floating gate transistor.

7. The method of claim 1, wherein:
   the inverted NAND string includes a string of inverted charge trap transistors.

8. The method of claim 7, wherein:
   the string of inverted charge trap transistors includes an inverted charge trap transistor, the inverted charge trap transistor includes a tunneling layer between a charge trapping layer of the inverted charge trap transistor and a control gate of the inverted charge trap transistor.

9. The method of claim 1, wherein:
   the inverted NAND string is formed above a substrate and oriented such that the inverted NAND string is orthogonal to the substrate.

10. The method of claim 1, wherein:
the non-volatile memory includes the memory array, the memory array is monolithically formed in one or more physical levels of memory cells having active areas disposed above a silicon substrate.

11. The method of claim 1, wherein:
the memory array comprises a three-dimensional memory array.

12. A non-volatile storage system, comprising:
a memory array, the memory array includes an inverted NAND string, the inverted NAND string includes a first memory cell transistor in series with a second memory cell transistor; and
one or more control circuits in communication with the memory array, the one or more control circuits configured to determine a selected word line voltage to be applied to a selected word line within the memory array, the selected word line is connected to a control gate of the first memory cell transistor, the one or more control circuits configured to determine an unselected word line voltage to be applied to a first unselected word line within the memory array, the first unselected word line is connected to a control gate of the second memory cell transistor, the one or more control circuits configured to determine a source line voltage to be applied to a first diffusion at a source-side end of the inverted NAND string and configured to determine a bit line voltage to be applied to a second diffusion at a drain-side end of the inverted NAND string, the one or more control circuits configured to initiate a read operation to read data from the first memory cell transistor, the one or more control circuits configured to cause the selected word line voltage to be applied to the selected word line during the read operation and the unselected word line voltage to be applied to the first unselected word line during the read operation, the one or more control circuits configured to cause the source line voltage to be applied to the first diffusion of the inverted NAND string during the read operation and the bit line voltage to be applied to the second diffusion of the inverted NAND string during the read operation, the first diffusion is of a different conductivity type than the second diffusion.

13. The non-volatile storage system of claim 12, wherein:
the first diffusion comprises a p-type source diffusion and the second diffusion comprises an n-type drain diffusion.

14. The non-volatile storage system of claim 12, wherein:
the read operation comprises a p-channel read operation, the unselected word line voltage is less than the selected word line voltage, the bit line voltage is less than the source line voltage.

15. The non-volatile storage system of claim 12, wherein:
the read operation comprises an n-channel read operation the unselected word line voltage is greater than the selected word line voltage, the bit line voltage is greater than the source line voltage.

16. The non-volatile storage system of claim 12, wherein:
the inverted NAND string includes a string of inverted floating gate transistors.

17. The non-volatile storage system of claim 16, wherein:
the string of inverted floating gate transistors includes an inverted floating gate transistor, the inverted floating gate transistor includes a tunneling layer between a floating gate of the inverted floating gate transistor and a control gate of the inverted floating gate transistor.

18. The non-volatile storage system of claim 12, wherein:
the inverted NAND string is formed above a substrate and oriented such that the inverted NAND string is orthogonal to the substrate.

19. The non-volatile storage system of claim 12, wherein:
the non-volatile storage system includes the memory array, the memory array is monolithically formed in one or more physical levels of memory cells having active areas disposed above a silicon substrate.

20. A method for operating a non-volatile memory, comprising:
acquiring data to be programmed into a first memory cell transistor of an inverted NAND string, the first memory cell transistor includes a tunneling layer that is arranged adjacent to a control gate of the first memory cell transistor;
determining a programming voltage to be applied to a selected word line connected to the control gate of the first memory cell transistor;
determining a pass voltage to be applied to a first unselected word line connected to a control gate of a second memory cell transistor of the inverted NAND string, the pass voltage is less than the programming voltage; and
performing a programming operation to program the data into the first memory cell transistor, the programming operation includes applying the programming voltage to the selected word line and applying the pass voltage to the first unselected word line, the programming operation causes a threshold voltage of the first memory cell transistor to be reduced.

* * * * *